(12) United States Patent
Kim et al.

(10) Patent No.: US 7,880,493 B2
(45) Date of Patent: Feb. 1, 2011

(54) PROBE PAD, SUBSTRATE HAVING A SEMICONDUCTOR DEVICE, METHOD OF TESTING A SEMICONDUCTOR DEVICE AND TESTER FOR TESTING A SEMICONDUCTOR DEVICE

(75) Inventors: Kun-Up Kim, Gyeonggi-do (KR); Chang-Sik Kim, Gyeonggi-do (KR); Tae-Sik Son, Gyeonggi-do (KR); Doo-Seon Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/567,583

(22) Filed: Sep. 25, 2009

(65) Prior Publication Data

US 2010/0013506 A1 Jan. 21, 2010

Related U.S. Application Data

(60) Division of application No. 11/131,767, filed on May 17, 2005, now Pat. No. 7,616,020, which is a continuation of application No. 11/565,471, filed on Nov. 30, 2006, now Pat. No. 7,612,573.

(30) Foreign Application Priority Data

May 18, 2004 (KR) ........................ 10-2004-0035260

(51) Int. Cl.
*G01R 31/02* (2006.01)
(52) U.S. Cl. ........................................ 324/763
(58) Field of Classification Search ............. 324/158.1, 324/750–755, 760–765; 257/979; 438/14
See application file for complete search history.

(56) References Cited

U.S. PATENT DOCUMENTS 5,321,352 A * 6/1994 Takebuchi .................... 324/758
7,733,108 B2 * 6/2010 Kanev et al. ................. 324/758

* cited by examiner

*Primary Examiner*—Minh N Tang
*Assistant Examiner*—Trung Q Nguyen
(74) *Attorney, Agent, or Firm*—Mills & Onello, LLP

(57) ABSTRACT

In an embodiment, a semiconductor device is tested using a probe pad that includes a probing region with which a probe needle makes contact, and a sensing region bordering an edge of the probing region. Electrical signals are applied, and measured results indicate the probe needle's location relative to a test position on the semiconductor device.

20 Claims, 24 Drawing Sheets

PROBE PAD, SUBSTRATE HAVING A SEMICONDUCTOR DEVICE, METHOD OF TESTING A SEMICONDUCTOR DEVICE AND TESTER FOR TESTING A SEMICONDUCTOR DEVICE

CROSS REFERENCE TO RELATED APPLICATION

This application is a Divisional of U.S. patent application Ser. No. 11/131,767, filed on May 17, 2005 now U.S. Pat. No. 7,616,020, which is a cotinuation in part of 11/565,471, filed on Nov. 30, 2006, now U.S. Pat. No. 7,612,537, which claims priority under 35 U.S.C. §119 from Korean Patent Application No. 2004-35260, filed on May 18, 2004, in the Korean Intellectual Property Office, the entire contents of which are hereby incorporated by reference

BACKGROUND OF THE INVENTION

1. Field of the Invention

The present invention relates to an apparatus and a method of testing a semiconductor device. More particularly, the present invention relates to a probe pad for electrically testing a semiconductor device, a substrate on which a semiconductor device is formed, a method of testing a semiconductor device, and a tester for testing a semiconductor device.

2. Description of the Related Art

Generally, a semiconductor device may be manufactured by a deposition process, a photolithography process, an etching process, an ion implantation process, a metal wiring process, etc. The above processes may be repeatedly carried out to form a plurality of semiconductor devices (hereinafter, referred to as chips) on a substrate.

After the chips are formed on the substrate, an electric die sorting (EDS) process for electrically testing the chips is performed on the substrate. According to the EDS process, a pre-laser test for determining whether the chips are normal or abnormal is performed. A laser repair process for repairing repairable chips among the abnormal chips is executed. A post-laser test for determining whether the repaired chips are normal or abnormal is carried out. A final test is then performed for determining whether the chips are normal or abnormal under conditions that are different from those in the pre-laser test and the post-laser test.

In the EDS process, after electrical signals are applied to pads on each of the chips, outputted data is determined to be normal or abnormal. To input/output the electrical signals into/from the pads, probe needles for transmitting the electrical signals make contact with the pads, respectively.

However, when the number of semiconductor devices having high capacity increase, number of pads for inputting/outputting the electrical signals also increase. Also, to reduce time for testing the chips on the substrate, the chips are wholly tested through one EDS process by simultaneously contacting the probe needles with the pads.

Since the numbers of the pads are increased, the probe needles may not accurately make contact with the pads, respectively. Further, as described above, since several EDS processes are executed on one chip and the probe needles make contact with the pads in the respective EDS processes, the probe needles make contact with the pads several times. Therefore, it is quite important that the probe needles accurately make contact with the pads.

When the probe needle makes contact with an edge of the pad, the pad may be greatly damaged by the probe needle. Further, the contact between the probe needle and the edge of the pad may not be detected by an electrical open/short test so that a probe failure may be generated, thereby determining a corresponding chip to be abnormal. As a result, a normal chip is treated to be abnormal so that yield of manufacturing a semiconductor device may be greatly reduced.

A method for preventing damage of a semiconductor device due to a probe needle is disclosed in Japanese Patent Laid-Open Publication No. 1996-111431. According to the method, a probe pad is divided into an inclined probe region and a bonding region.

However, the probe pad may have an increased area due to the division of the probe pad. Also, when the probe needle makes contact with an edge of the probe pad, the above-mentioned probe failure may be generated. Further, the conventional method may not be employable in a wafer level package that is currently sold.

SUMMARY OF THE INVENTION

Embodiments of the present invention provide a probe pad that is capable of detecting a probe failure.

Embodiments of the present invention also provide a substrate having a semiconductor device on which the above-mentioned probe pad is mounted.

Embodiments of the present invention still also provide a method of testing the above-mentioned semiconductor device having the probe pad.

Embodiments of the present invention still also provide a tester for testing the above-mentioned semiconductor device having the probe pad.

A probe pad in accordance with one embodiment of the present invention includes a probing region with which a probe needle makes contact, and a sensing region bordering an edge of the probing region.

A substrate having a semiconductor device in accordance with another embodiment of the present invention includes a first pad for inputting/outputting data signals into/from the semiconductor device, and a second pad including a probing region with which a probe needle makes contact and a sensing region bordering an edge of the probing region.

In a method of testing a semiconductor device in accordance with still another embodiment of the present invention, probe needles make contact with a first pad for inputting/outputting data signals into/from the semiconductor device, and a second pad including a probing region with which a probe needle makes contact and a sensing region bordering an edge of the probing region, respectively. A determination is made as to whether or not there is a contact between the sensing region of the second pad and the probe needle. The electrical signal is applied to the first pad to test the semiconductor device in accordance with the recognized contact.

A tester for testing a semiconductor device in accordance with still another embodiment of the present invention includes an electrical signal applicator for applying a first electrical signal to a first pad and a second pad, respectively. The first pad is used for inputting/outputting data signals into/from the semiconductor device. The second pad is used for testing a position of a probe needle that makes contact with the first pad. An electrical signal measurer measures a second signal outputted from the second pad. A controller controls whether a test of the semiconductor device proceeds or not in accordance with the measured second signal.

According to the present invention, after the contact between the probe needle and the probe pad in an EDS process is recognized, the semiconductor device is tested.

BRIEF DESCRIPTION OF THE DRAWINGS

The above and other features and advantages of the invention will become readily apparent by reference to the following detailed description when considered in conjunction with the accompanying drawings.

DESCRIPTION OF THE EMBODIMENTS

Figure 1:
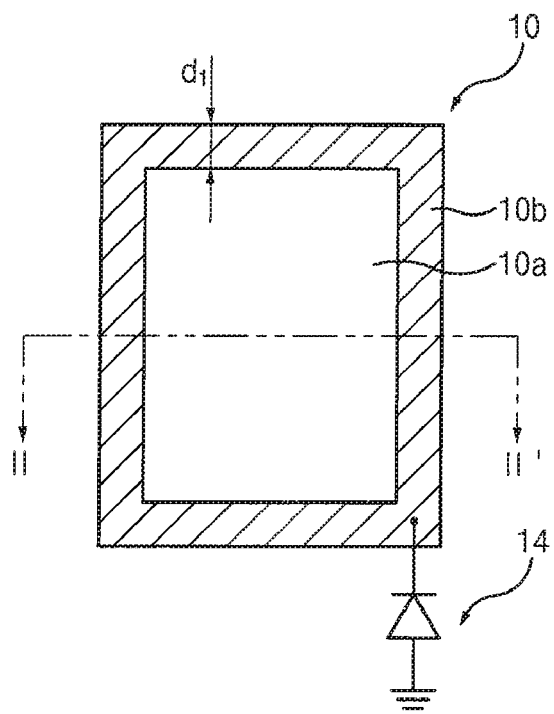
FIG. 1 is a plan view illustrating a probe pad in accordance with a first embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like reference numerals refer to similar or identical elements throughout. It will be understood that when an element such as a layer, a region or a substrate is referred to as being "on" or "onto" another element, it can be directly on the other element or intervening elements may also be present.

Embodiment 1

Figure 2:
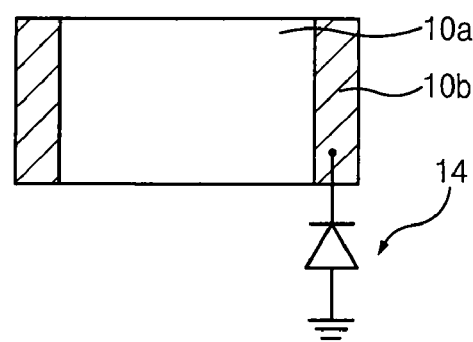
FIG. 2 is a cross sectional view taken along line II-II' in FIG. 1.

FIG. 1 is a plan view illustrating a probe pad in accordance with a first embodiment of the present invention. FIG. 2 is a cross sectional view taken along line II-II' in FIG. 1.

A probe pad 10 in accordance with the present embodiment includes a rectangular probing region 10a. The probing region 10a corresponds to a region with which a probe needle normally makes contact. The probing region 10a has first sides and second sides shorter than the first sides. The second sides are substantially perpendicular to the first sides. Particularly, the second sides are substantially parallel to a sliding direction of a probe needle.

The probing region 10a includes an insulation material. Examples of the insulation material are silicon oxide, silicon nitride, etc. When the probe needle strongly makes contact with the probing region 10a including silicon nitride, the probing region 10a may be broken. Thus, in the preferred embodiment, the probing region 10a includes silicon oxide.

A sensing region 10b borders an edge of the probing region 10a. Namely, the sensing region 10b encloses the edge of the probing region 10a. The sensing region 10b is used for sensing whether the probe needle makes contact with a region beyond the probing region 10a. The sensing region 10b includes a conductive material such as a metal.

The sensing region 10b has a width d1 extending the first and second sides of the probing region 10a. Accordingly, the probe pad 10 including the probing region 10a and the sensing region 10b has a rectangular shape.

When the probe needle makes contact with the sensing region 10b, a position failure of the probe needle is detected. Thus, when the width d1 of the sensing region 10b is too narrow, the position failure of the probe needle may be insufficiently detected. On the contrary, when the width d1 of the sensing region 10b is too wide, the position failure of the probe needle may be excessively detected. Accordingly, the width d1 of the sensing region 10b is preferably about 2 μm to about 20 μm.

Referring to FIG. 2, the probing region 10a and the sensing region 10b have upper faces, respectively, that are positioned on substantially the same plane.

Figure 3:
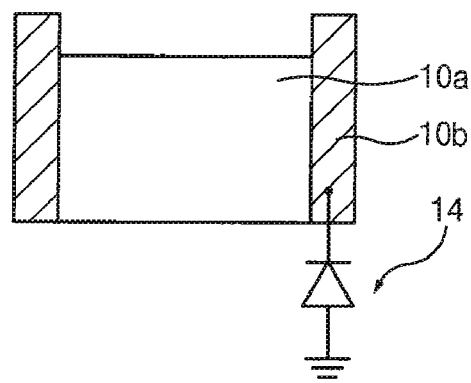
FIGS. 3 and 4 are cross sectional views illustrating the probe pad in FIG. 1 in accordance with other variations.
Figure 4:
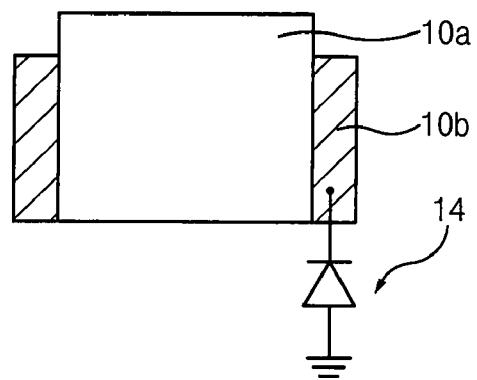

FIGS. 3 and 4 are cross sectional views illustrating the probe pad in FIG. 1 in accordance with other variations.

Referring to FIGS. 3 and 4, stepped portions are formed between the probing region 10a and the sensing region 10b.

Namely, as shown in FIG. 3, the sensing region 10b has an upper face higher than that of the probing region 10a. Also, as shown in FIG. 4, the sensing region 10b has an upper face lower than that of the probing region 10a. Here, the difference between heights of the probing region 10a and the sensing region 10b is restricted within a depth allowing a contact between the probe needle and the probing region 10a or the sensing region 10b.

The sensing region 10b is electrically connected to a sensing circuit 14. The sensing circuit 14 includes a resistor electrically connected to the sensing region 10b and a ground, respectively. Examples of the resistor are a resistance, a diode, (a P-N junction diode or a MOS diode), etc. Alternatively, the sensing region 10b may be electrically connected to a ground without being electrically connected to a resistor or diode.

As described above, the sensing region 10b encloses the probing region 10a so that each part of the sensing region 10b is entirely connected to each other part. Therefore, one sensing circuit 14 is electrically connected to the sensing region 10b.

Embodiment 2

Figure 5:
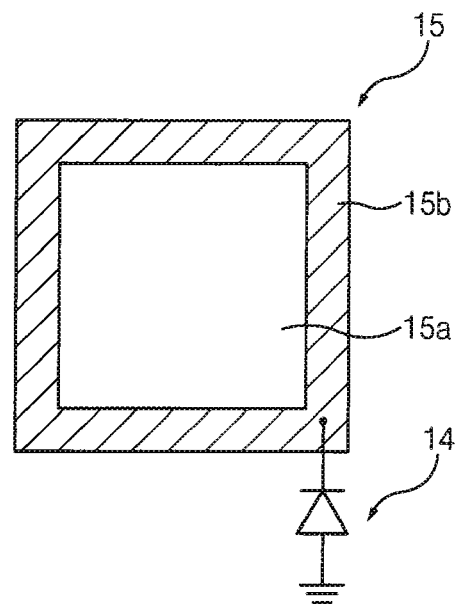
FIG. 5 is a plan view illustrating a probe pad in accordance with a second embodiment of the present invention.

FIG. 5 is a plan view illustrating a probe pad in accordance with a second embodiment of the present invention. The probe pad 15 in accordance with the present embodiment includes elements substantially identical to those of the probe pad 10 in accordance with Embodiment 1 except for configurations.

The probe pad 15 in accordance with the present embodiment includes a square probing region 15a. The probing region 15a corresponds to a region with which a probe needle normally makes contact. The probing region 15a includes an insulation material. Examples of the insulation material are silicon oxide, silicon nitride, etc. In the preferred embodiment, the probing region 15a includes silicon oxide.

A sensing region 15b borders an edge of the probing region 15a. Namely, the sensing region 15b encloses the edge of the probing region 15a. The sensing region 15b is used for sensing whether the probe needle makes contact with a region beyond the probing region 15a. The sensing region 15b includes a conductive material such as a metal.

The sensing region 15b has one or more widths that extend the sides of the probing region 15a. The widths of the sensing region 15b are substantially identical to, or different from, each other. Namely, the sensing region 15b may have a square shape, as shown in FIG. 5, or a rectangular shape. That is, the sensing region 15b can either form a square periphery about the square probing region 15a, or a rectangular periphery (not shown) about the square probing region 15a.

Embodiment 3

Figure 6:
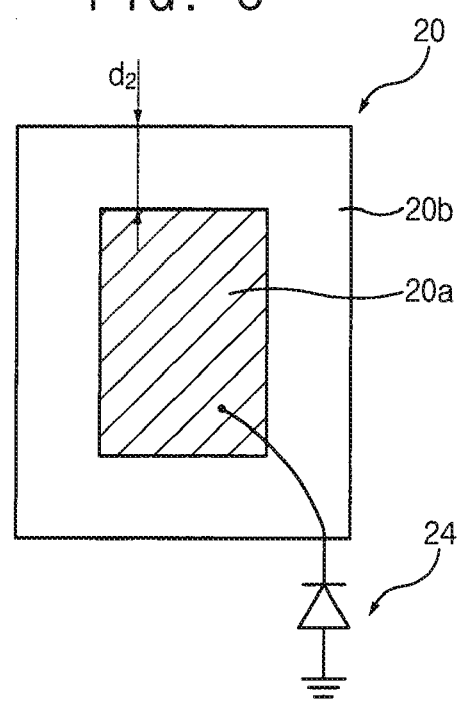
FIG. 6 is a plan view illustrating a probe pad in accordance with a third embodiment of the present invention.

FIG. 6 is a plan view illustrating a probe pad in accordance with a third embodiment of the present invention.

A probe pad 20 in accordance with the present embodiment includes a rectangular probing region 20a. Alternatively, the probe pad 20 may have a square shape. The probing region 20a corresponds to a region with which a probe needle normally makes contact. The probing region 20a includes a conductive material such as a metal.

A sensing region 20b borders an edge of the probing region 20a. Namely, the sensing region 20b encloses the edge of the probing region 20a. The sensing region 20b is used for sensing whether the probe needle makes contact with a region beyond the probing region 20a. The sensing region 20b includes an insulation material. Examples of the insulation material are silicon oxide, silicon nitride, etc.

The probing region 20a is electrically connected to a sensing circuit 24. The sensing circuit 24 includes a resistor electrically connected to the probing region 20a and a ground, respectively. Examples of the resistor are a resistance, a diode, (a P-N junction diode or a MOS diode), etc. Alternatively, the probing region 20a may be electrically connected to a ground without being electrically connected to a resistor or diode.

When the probe needle makes contact with the sensing region 20b, a position failure of the probe needle is detected. On the contrary, when the probe needle makes contact with the probing region 20a and the sensing region 20b together, the position failure of the probe needle is not detected. Therefore, the sensing region 20b may have a width wider than that of the sensing region 10b in Embodiment 1.

When the width d2 of the sensing region 20b is too narrow, the position failure of the probe needle may be insufficiently detected. On the contrary, when the width of the sensing region 20b is too wide, the position failure of the probe needle may be excessively detected. Accordingly, the width of the sensing region 10b is preferably about 2 μm to about 20 μm.

Embodiment 4

Figure 7:
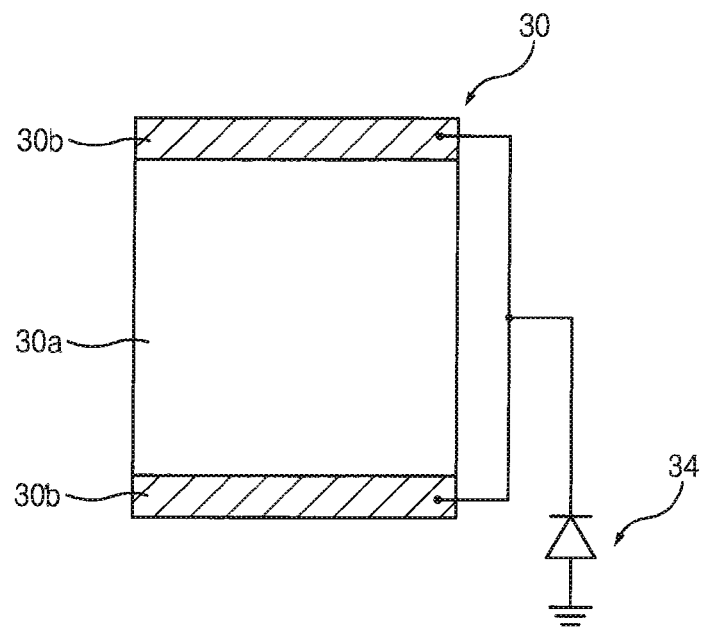
FIG. 7 is a plan view illustrating a probe pad in accordance with a fourth embodiment of the present invention.

FIG. 7 is a plan view illustrating a probe pad in accordance with a fourth embodiment of the present invention.

A probe pad 30 in accordance with the present embodiment includes a rectangular probing region 30a. Alternatively, the probe pad 30 may have a square shape. The probing region 30a has first sides and second sides shorter than the first sides. The second sides are substantially perpendicular to the first sides. Particularly, the second sides are substantially parallel to a sliding direction of a probe needle.

Two sensing regions 30b border the second sides of the probing region 30a. Alternatively, one sensing region 30b may border any one of the second sides. Also, the sensing regions 30b may border the first sides of the probing region 30a. The sensing regions 30b have a width of about 2 μm to about 20 μm.

Here, a position failure of the probe needle may be frequently generated at the second sides substantially parallel to the sliding direction of the probe needle. Thus, the sensing regions 30b preferably borders the second sides of the probing region 30a. Hereinafter, the sliding direction of the probe needle is referred to as a Y-direction and a direction substantially perpendicular to the Y-direction is referred to as an X-direction.

As shown in FIG. 7, when the sensing regions 30b are formed at the second sides of the probing region 30a, the sensing regions 30b are separated from each other. Thus, after the separated sensing regions 30b are electrically connected to each other, the sensing regions 30b are electrically connected to a sensing circuit 34. Alternatively, the sensing regions 30b may be electrically connected to two separate sensing circuits 34, respectively. The sensing circuit 34 includes a resistor electrically connected to the sensing region 30b and a ground, respectively. Examples of the resistor are a resistance, a diode (a P-N junction diode or a MOS diode), etc.

Embodiment 5

Figure 8:
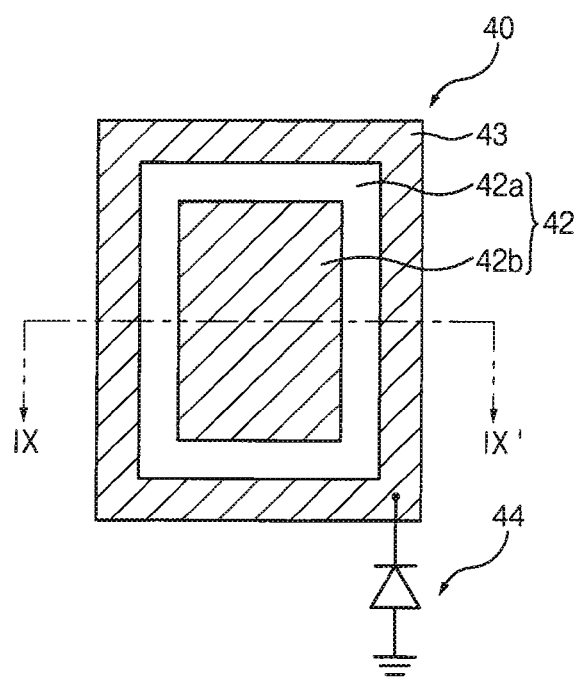
FIG. 8 is a plan view illustrating a probe pad in accordance with a fifth embodiment of the present invention.
Figure 9:
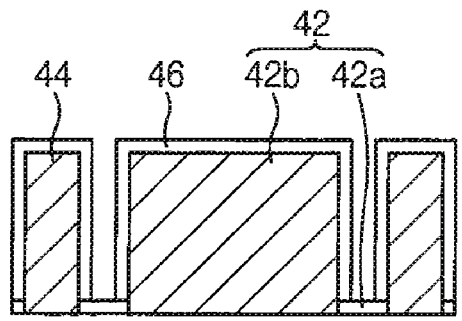
FIG. 9 is a cross sectional view taken along line IX-IX' in FIG. 8.

FIG. 8 is a plan view illustrating a probe pad in accordance with a fifth embodiment of the present invention. FIG. 9 is a cross sectional view taken along line IX-IX' in FIG. 8.

A probe pad 40 in accordance with the present embodiment includes a rectangular probing region 42. Alternatively, the probing region 42 may have a square shape. To sense whether a probe needle makes contact with a region beyond the probing region 42, a sensing region 43 borders an edge of the probing region 42.

The probing region 42 includes a first region 42a including a first material and a second region 42b including a second material different from, and harder than, the first material. The first material includes an insulation material such as silicon oxide or silicon nitride. The second material includes a metal. The first region 42a borders the sensing region 43. The second region 42b is placed in the first region 42a. Thus, the second region 42b is not contiguous with the sensing region 43. The second region 42b prevents a structure from being damaged under the probe pad 40 due to a contact of the probe needle.

The sensing region 43 includes a conductive material such as a metal. The sensing region 43 has a width that extends sides of the probing region 42. The width of the sensing region 43 is about 2 μm to about 20 μm. The sensing region 43 is electrically connected to a sensing circuit 44.

Referring to FIG. 9, the first region 42a has an upper face lower than that of the second region 42b. A step difference between the upper faces of the first and second regions 42a and 42b is about 3,000 Å to about 8,000 Å.

The first region 42a has a width that extends sides of the sensing region 43. When the width of the first region 42a is too narrow, the second region 42b is partially detached due to the contact of the probe needle so that a short between the second region 42b and the sensing region 43 may be generated. On the contrary, when the width of the first region 42a is too wide, the probe needle may be damaged. Accordingly, the width of the first region 42a is preferably about 2 μm to about 20 μm.

Also, the upper face of the second region 42b and an upper face of the sensing region 43 are positioned on a substantially same plane.

Additionally, a protection layer 46 including an insulation material may be formed on the second region 42b and the sensing region 43. The protection layer 46 has a thickness to be removed by a pressure applied from the probe needle. The thickness of the protection layer 46 may be about 100 Å to about 2,000 Å. The protection layer 46 includes the insulation material substantially identical to that of the first region 42a. The sensing regions 43 are electrically connected to a sensing circuit 44. The sensing circuit 44 includes a resistor electrically connected to the sensing region 43 and a ground, respectively. Examples of the resistor are a resistance, a diode (a P-N junction diode or a MOS diode), etc.

Embodiment 6

Figure 10:
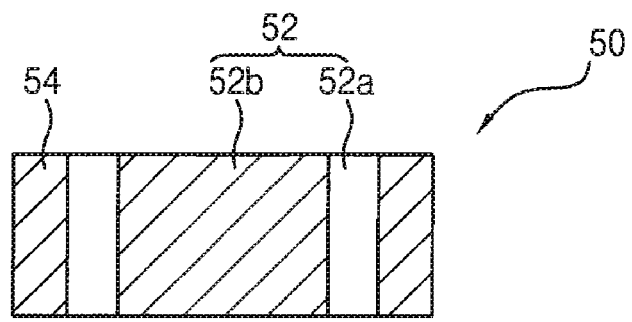
FIG. 10 is a cross sectional view illustrating a probe pad in accordance with a sixth embodiment of the present invention.

FIG. 10 is a cross sectional view illustrating a probe pad in accordance with a sixth embodiment of the present invention.

A probe pad 50 in accordance with the present embodiment includes a rectangular probing region 52. Alternatively, the probing region 52 may have a square shape. To sense whether a probe needle makes contact with a region beyond the probing region 52, a sensing region 54 borders an edge of the probing region 52.

The probing region 52 includes a first region 52a including a first material, and a second region 52b including a second material different from, and harder than, the first material. The first material includes an insulation material and the second material includes a metal. The first region 52a borders the sensing region 54. The second region 52b is placed in the first region 52a. Thus, the second region 52b is not connected to the sensing region 54.

The first and second regions 52a and 52b have upper faces that are positioned on a substantially same plane. Namely, a step difference between the upper faces of the first and second regions 52a and 52b does not exist.

Additionally, a protection layer (not shown) including an insulation material may be formed on the first and second regions 52a and 52b and the sensing region 54. The protection layer has a thickness to be removed by a pressure applied from the probe needle.

Embodiment 7

Figure 11:
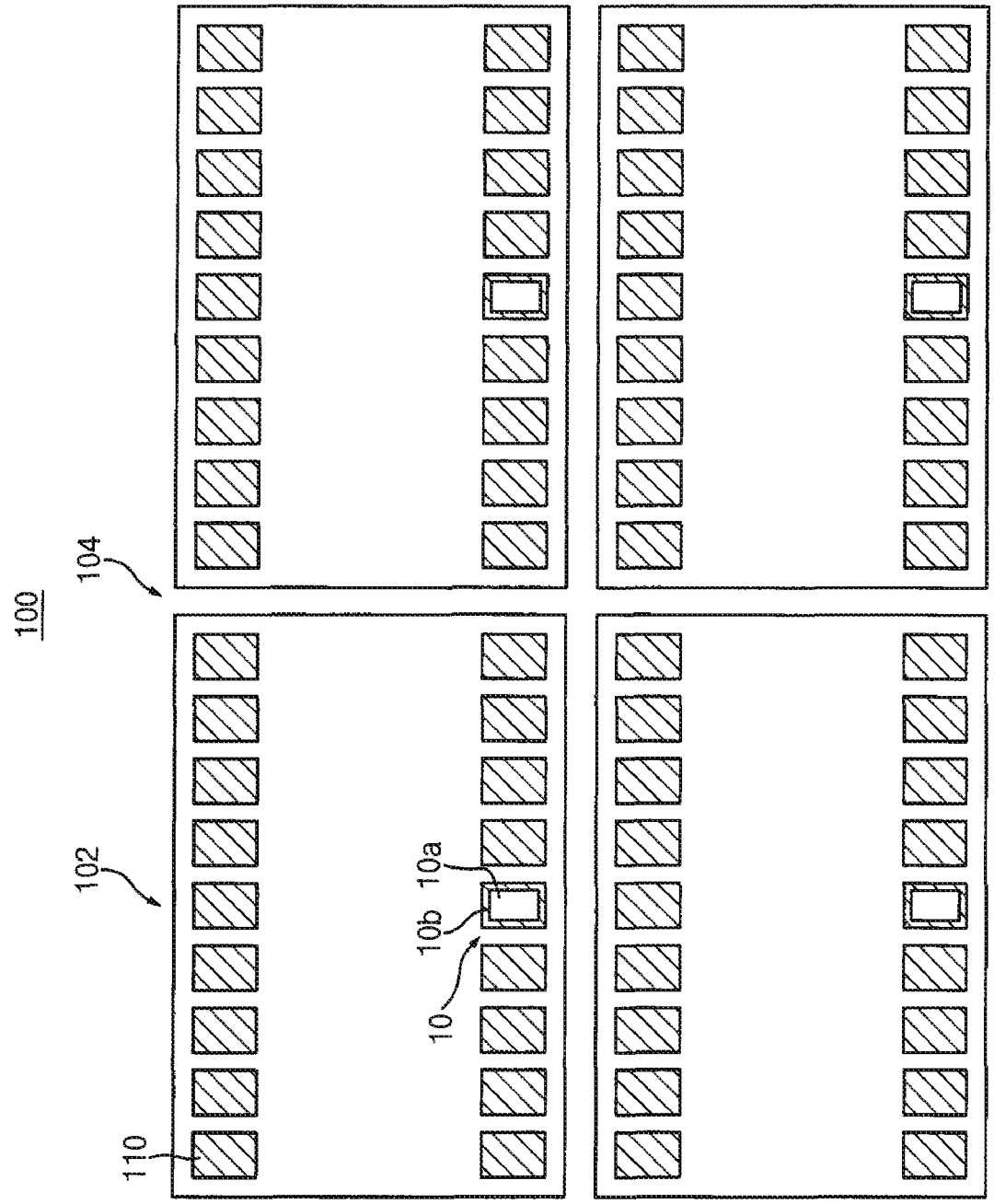
FIGS. 11 to 13 are plan views illustrating a substrate having a semiconductor device in accordance with a seventh embodiment of the present invention.
Figure 12:
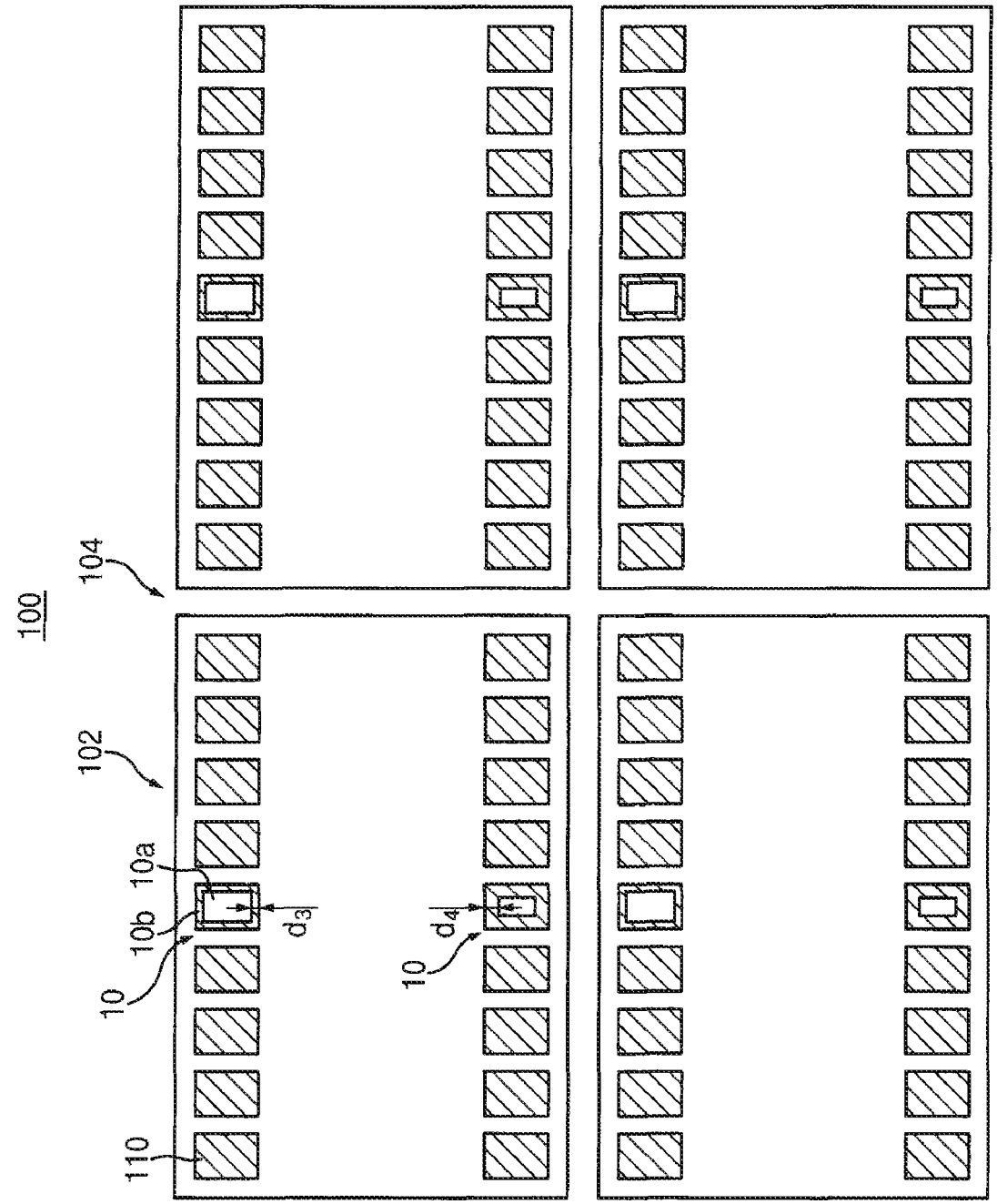
Figure 13:
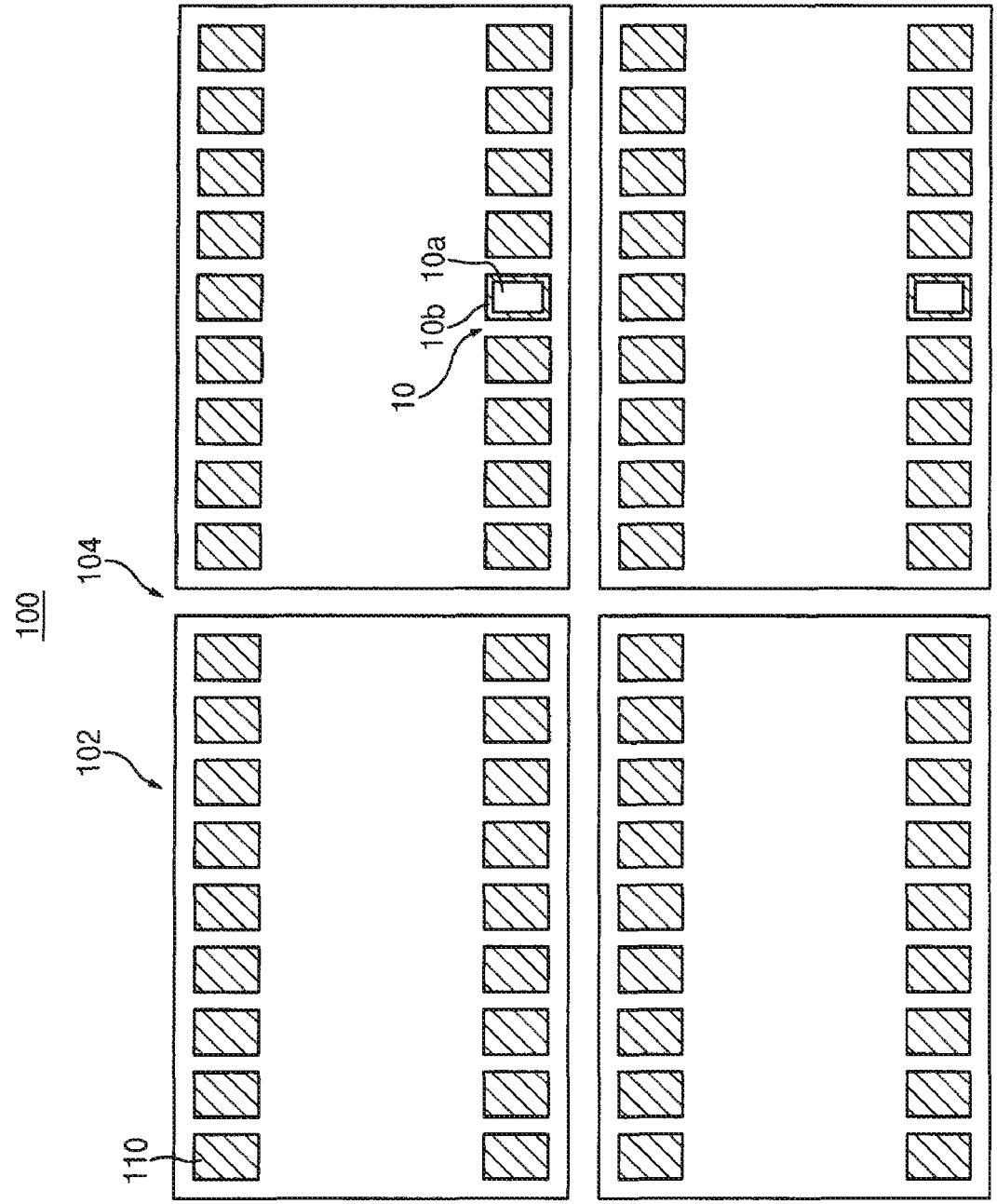
Figure 14:
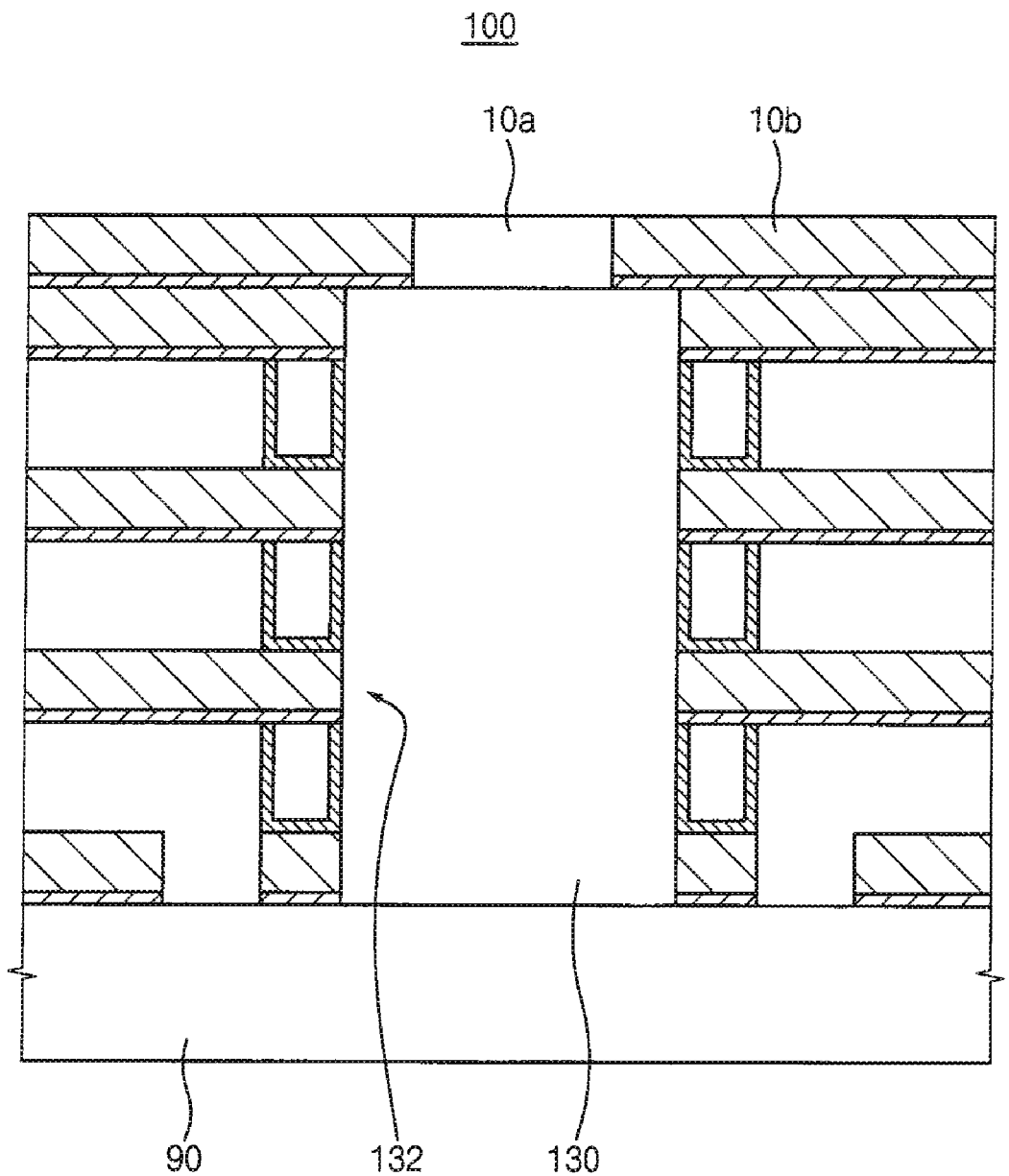
FIG. 14 is a cross sectional view illustrating a second pad of the semiconductor device in FIGS. 11 to 13.

FIGS. 11 to 13 are plan views illustrating a substrate having a semiconductor device in accordance with a seventh embodiment of the present invention. FIG. 14 is a cross sectional view illustrating a second pad of the semiconductor device in FIGS. 11 to 13.

A substrate 100 is divided into chip regions 102 and scribe lanes 104 between the chip regions 102. A plurality of semiconductor devices is formed in the chip regions 102, respectively.

Structures in each semiconductor device are formed in the chip regions 102, respectively. A plurality of first pads 110 for inputting/outputting data signals into/from the unitary semiconductor device is provided on the structures. The first pads 110 include a conductive material. A passivation layer (not shown) for protecting the first pads 110 may be formed at a periphery of the first pads 110. Additionally, a protection circuit (not shown) for electrically protecting the first pads 110 may be electrically connected to the first pads 110. The protection circuit includes a resistor connected to a ground. Examples of the resistor are a resistance, a diode, (a P-N junction diode or a MOS diode), etc.

A second pad 10, which was introduced in FIG. 1, is formed on the chip region 102. The second pad 10 is used for recognizing a normal contact between the first pad 110 and a probe needle.

In particular, the second pad 10 includes a probing region 10a with which the probe needle makes contact, and a sensing region 10b bordering an edge of the probing region 10a. The sensing region 10b is used for sensing whether the probe needle makes contact with a region beyond the probing region 10a. The second pad 10 is substantially identical to the probe pad in Embodiment 1. Thus, any further illustrations of the second pad 10 are omitted.

A resistor including a sensing circuit that is electrically connected to the second pad 10 has a resistance value lower than that of the resistor in the protection circuit. The second pad 10 does not participate in operations of the semiconductor device. However, the second pad 10 may be used for recognizing the normal contact of the probe needle. The resistor of the sensing circuit, with the relatively low resistance value, increases a measurement sensitivity with respect to any position failure of the probe needle.

The first and second pads 110 and 10 have substantially identical configurations. The second pad 10 may be arranged parallel to the first pad 110. The second pad 10 may be provided to only a single semiconductor device, respectively, as shown in FIG. 11. Alternatively, the second pad 10 may be provided to a group including at least two semiconductor devices.

As shown in FIG. 12, two or more second pads 10 are provided to the single semiconductor device. When a plurality of second pads 10 is provided to the single semiconductor device, the second pads 10 occupy a large area on the semiconductor device, although capacity for sensing an electrical signal is increased. Additionally, any one of the second pads 10 may have a width d3. The rest of the second pads 10 may have a width d4 wider than the width d3. Therefore, an accurate position on the first and second pads 110 and 10 with which the probe needle makes contact may be obtained.

In particular, when the second pads 10 including the sensing regions 10b that have different widths are provided to the single semiconductor device, the probe needles make contact with the second pads 10, respectively. Here, the probe needles may make contact with the probing regions 10a or the sensing regions 10b. Alternatively, any one of the probe needles may make contact with the sensing region 10b having the width d4 in the second pad 10 having the width d4 and the rest of the probe needles may make contact with the probing region 10a of the second pad 10 that includes the sensing region 10b having the width d3. Therefore, the position on the first and second pads 110 and 10 with which the probe needle makes contact may be indirectly recognized by using the contact between the probe needle and the probing region 10a or the sensing region 10b in accordance with the different widths.

As shown in FIG. 13, only single second pad 10 is provided to the group, including two semiconductor devices. Therefore the number of the second pads 10 provided to the substrate 100 is reduced. As a result, the number of signal channels of a tester, which is configured to electrically connected to the second pads 10, may be decreased.

Referring to FIG. 14, only an insulation layer pattern 130 including silicon oxide is formed between a lower face of the probing region 10a in the second pad 10 and a lower bulk substrate 90. When a structure is formed under the lower face of the probing region 10a, the structure may be damaged by the contact between the second pad 10 and the probe needle.

A barrier pattern 132 is formed at sides of the insulation layer pattern. The barrier pattern 132 prevents the probe needles from inserting into structures at a periphery of the insulation layer pattern 130. Thus, the barrier pattern 132 includes a material such as a metal harder than the insulation layer pattern 130.

Embodiment 8

Figure 15:
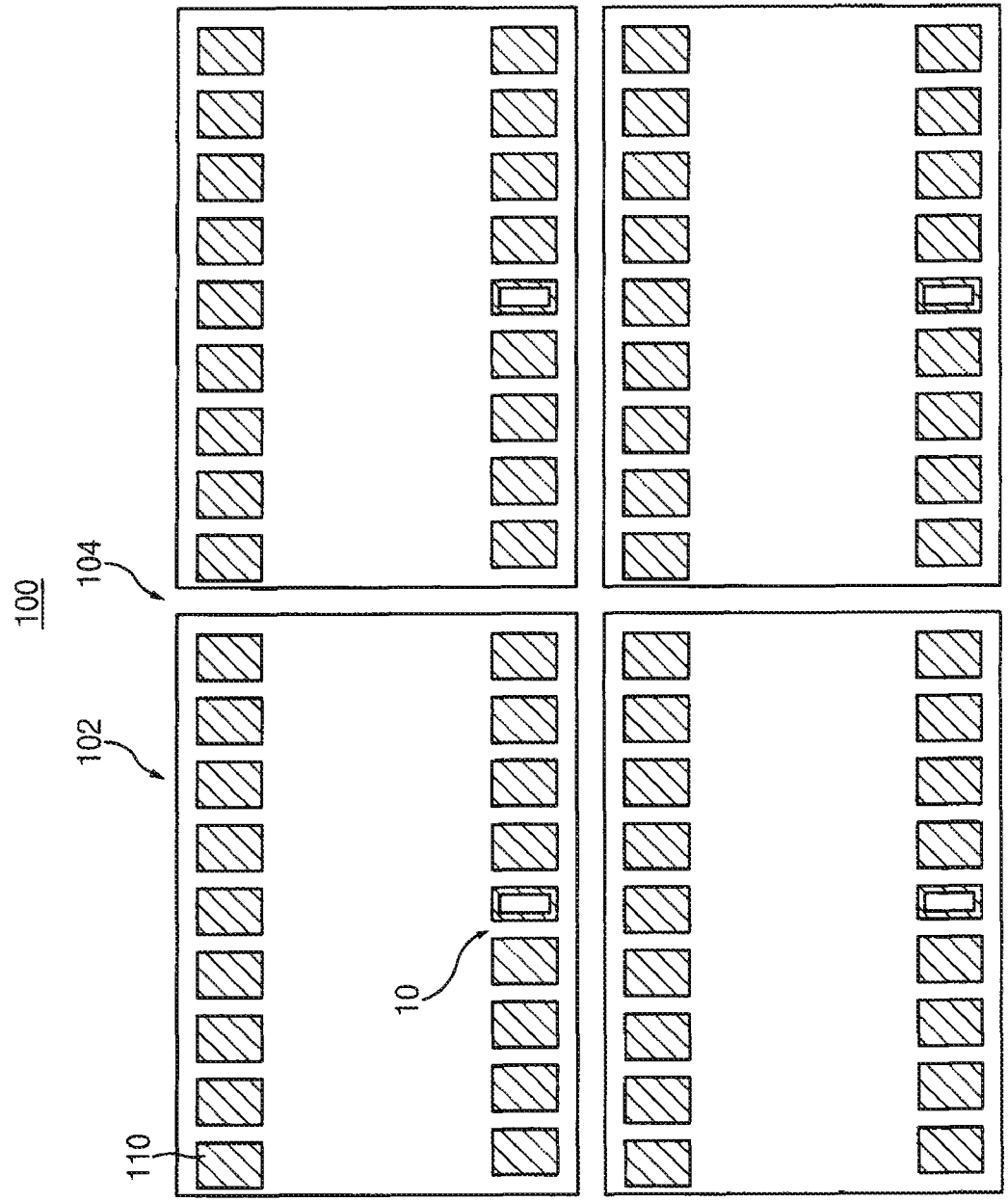
FIG. 15 is a plan view illustrating a substrate having a semiconductor device in accordance with an eighth embodiment of the present invention.

FIG. 15 is plan view illustrating a substrate having a semiconductor device in accordance with an eighth embodiment of the present invention. The substrate in accordance with the present embodiment includes elements substantially identical to those of the substrate in accordance with Embodiment 7 except sizes of a second pad. Thus, same reference numerals refer to same elements and any further illustrations of the same elements are omitted.

Referring to FIG. 15, the second pad 10 includes second sides that are parallel to a sliding direction of a probe needle. The second sides of the second pad 10 have a length substantially identical to that of second sides of the first pad 110. Additionally, first sides of the second pad substantially perpendicular to the second sides may have a length shorter than that of first sides of the first pad 110.

According to the present embodiment, the second pad 10 occupies a relatively small area on the substrate.

Embodiment 9

Figure 16:
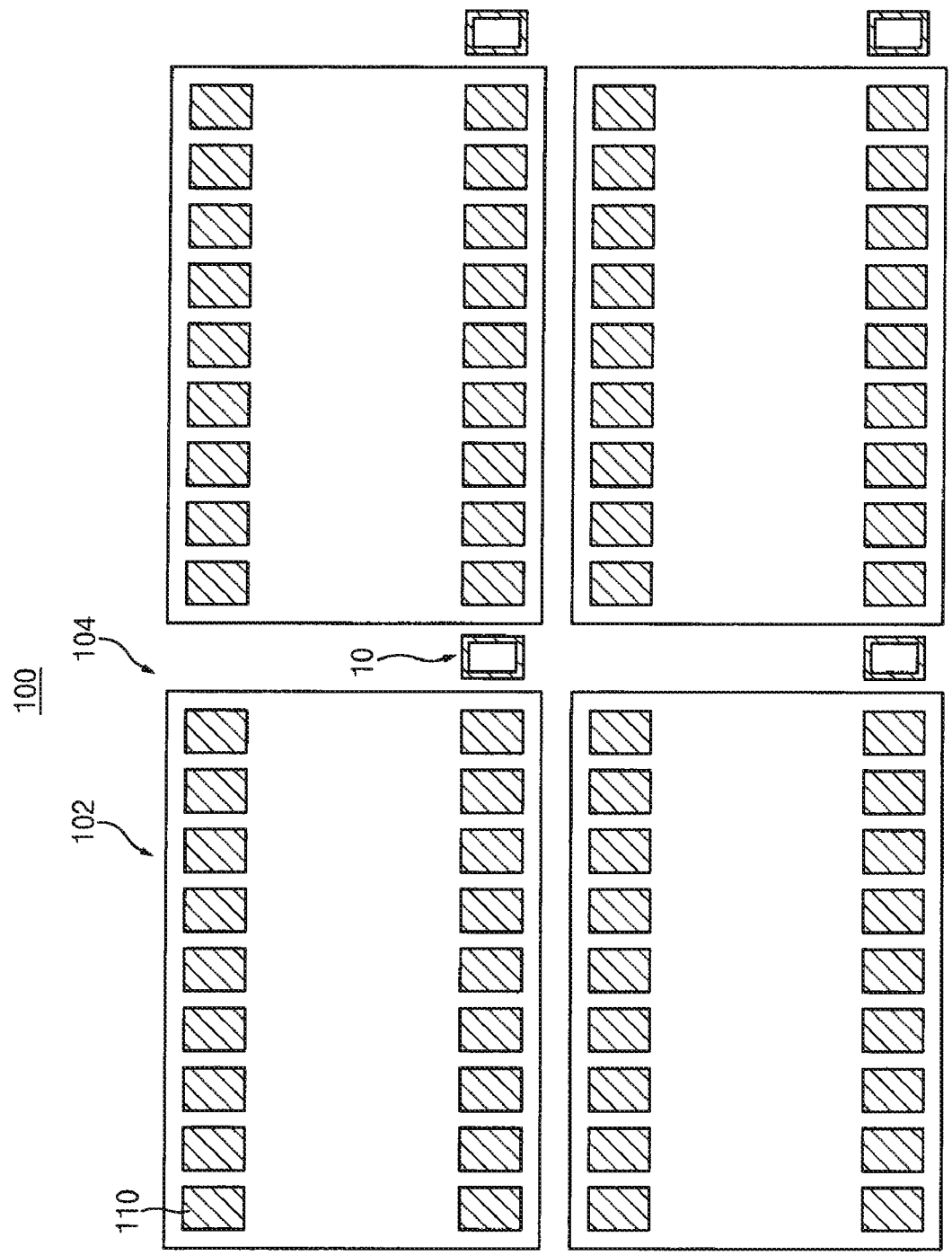
FIGS. 16 to 18 are plan views illustrating a substrate having a semiconductor device in accordance with a ninth embodiment of the present invention.
Figure 17:
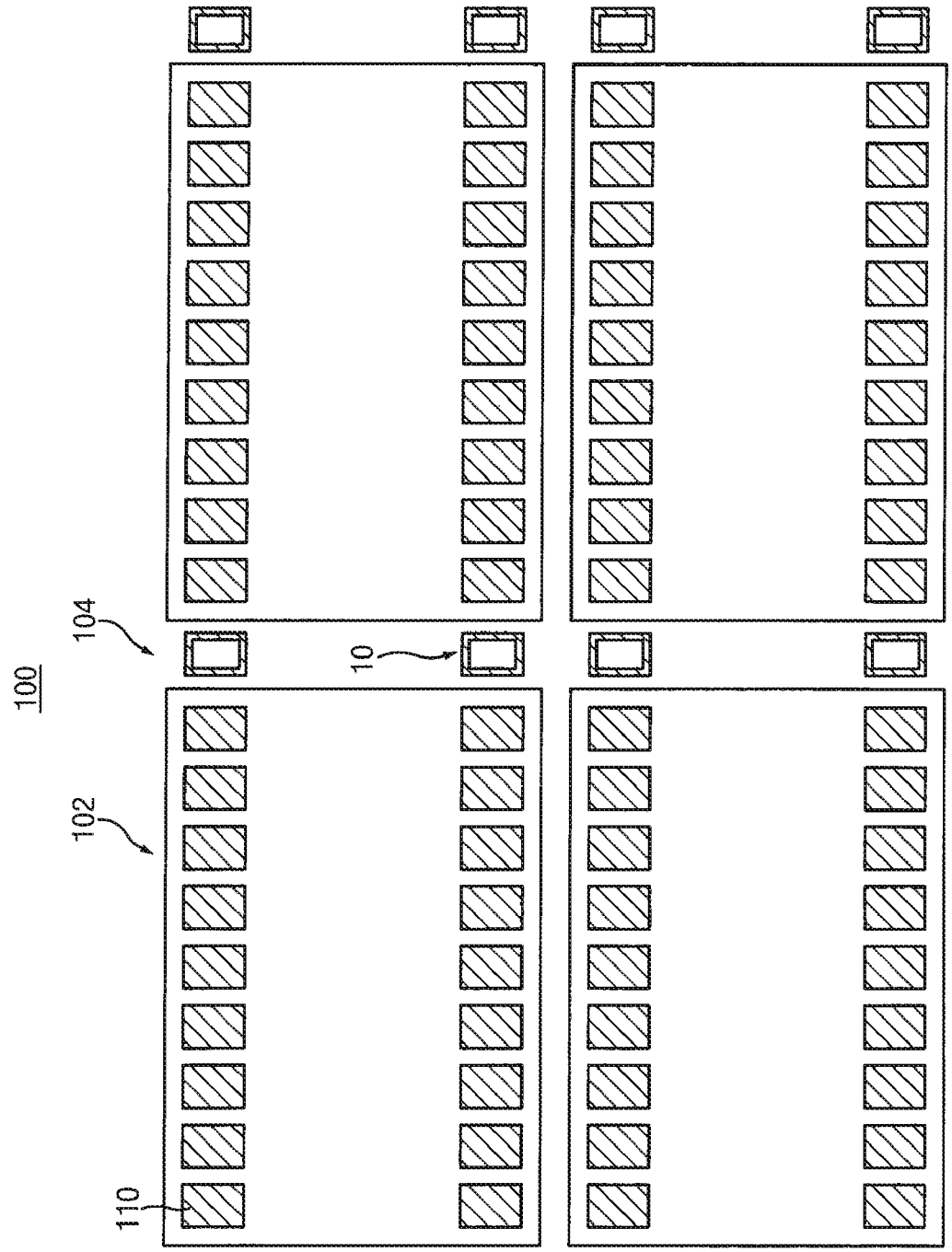
Figure 18:
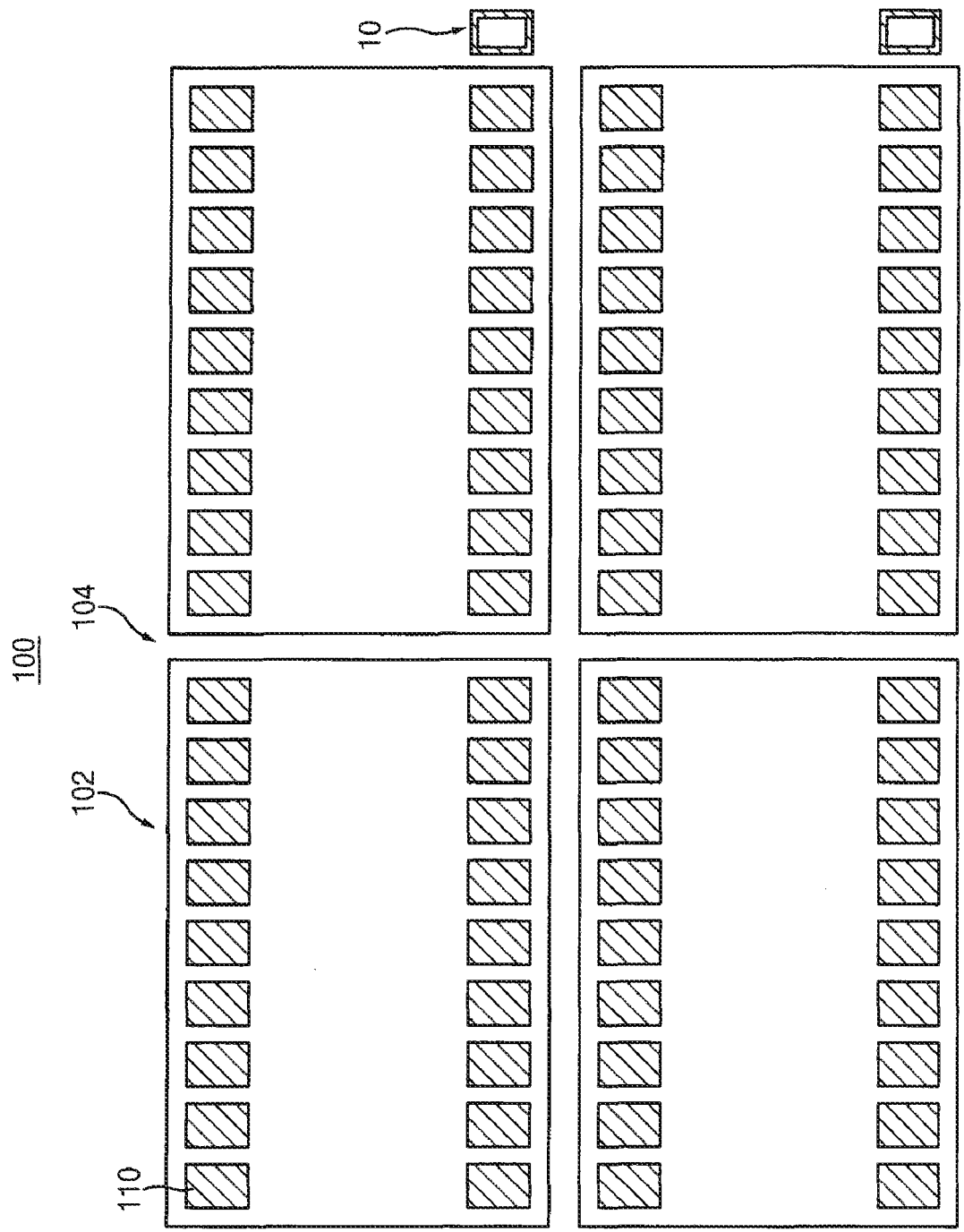

FIGS. 16 to 18 are plan views illustrating a substrate having a semiconductor device in accordance with a ninth embodiment of the present invention. The substrate in accordance with the present embodiment includes elements substantially identical to those of the substrate in accordance with Embodiment 7 except position of a second pad. Thus, same reference numerals refer to same elements and any further illustrations of the same elements are omitted.

A substrate 100 is divided into chip regions 102 and scribe lanes 104 between the chips regions 102. A plurality of semiconductor devices (not shown) is formed in the chip regions 102, respectively.

A plurality of first pads 110 for inputting/outputting data signals into/from each of the semiconductor devices is provided on the semiconductor devices. The first pads 110 include a conductive material. A protection circuit (not shown) for electrically protecting the first pads 110 may be electrically connected to the first pads 110. The protection circuit includes a resistor connected to a ground.

A second pad 10 is formed on the scribe lanes 104. The second pad 10 is used for recognizing a normal contact between the first pad 110 and a probe needle. The second pad 10 includes a probing region 10a with which the probe needle makes contact, and a sensing region 10b bordering an edge of the probing region 10a. The sensing region 10b is used for sensing whether the probe needle makes contact with a region beyond the probing region 10a. The second pad 10 is substantially identical to the probe pad in Embodiment 1. Thus, any further illustrations of the second pad 10 are omitted.

The second pad 10 may be arranged parallel to the first pads 110. The second pad 10 has a configuration and a size substantially identical to those of the first pads 110. Single second pad 10 may be arranged on the scribe lane 104 that is positioned between adjacent two semiconductor devices. Alternatively, a single second pad 10 may be arranged on the scribe lane 104 that is positioned between groups including at least one semiconductor device.

As shown in FIG. 16, a single second pad 10 is arranged on the scribe lane 104 between two semiconductor devices.

As shown in FIG. 17, a plurality of second pads 10 is arranged on the scribe lane 104 between two semiconductor devices.

As shown in FIG. 18, a pair of second pads 10 is arranged on the scribe lane 104 between the groups including one semiconductor device.

According to the present embodiment, when the second pad 10 is arranged on the scribe lane 104, an area of the chip region is not reduced due to the second pad 10. Also, the substrate is sawed along the scribe lane 104 so that a final semiconductor device may have an original configuration.

Embodiment 10

Figure 19:
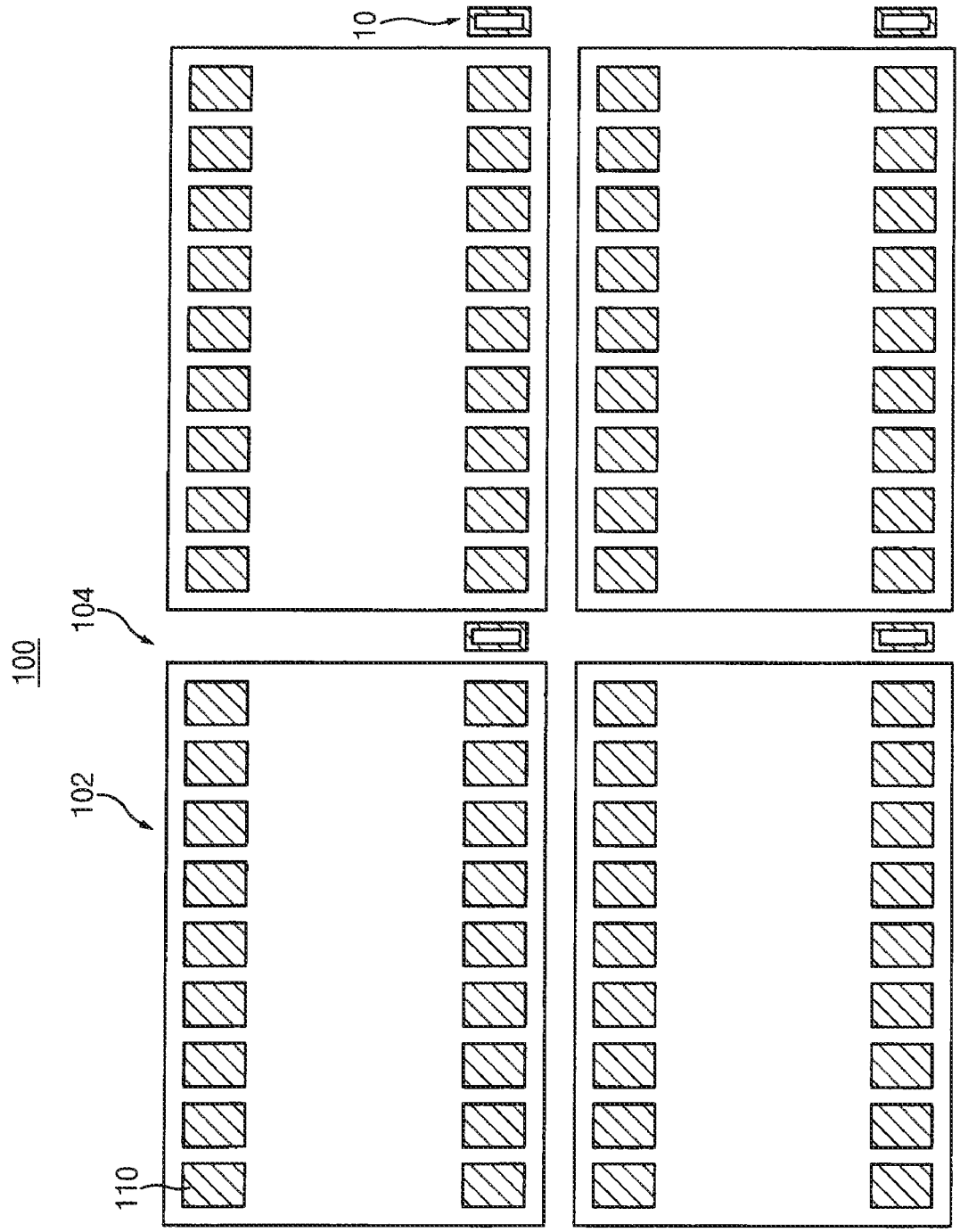
FIG. 19 is a plan view illustrating a substrate having a semiconductor device in accordance with a tenth embodiment of the present invention.

FIG. 19 is plan view illustrating a substrate having a semiconductor device in accordance with a tenth embodiment of the present invention. The substrate in accordance with the present embodiment includes elements substantially identical to those of the substrate in accordance with Embodiment 9 except sizes of a second pad. Thus, same reference numerals refer to same elements and any further illustrations of the same elements are omitted.

Referring to FIG. 19, the second pad 10 includes second sides that are parallel to a sliding direction (Y-direction) of a probe needle. The second sides of the second pad 10 have a length substantially identical to that of second sides of the first pad 110. Additionally, first sides of the second pad that are substantially parallel to an X-direction that is substantially perpendicular to the Y-direction may have a length shorter than that of first sides of the first pad 110.

The present embodiment may be employed if a length of the scribe lane 104 in the X-direction is shorter than that of first sides of the first pad 110.

Embodiment 11

Figure 20:
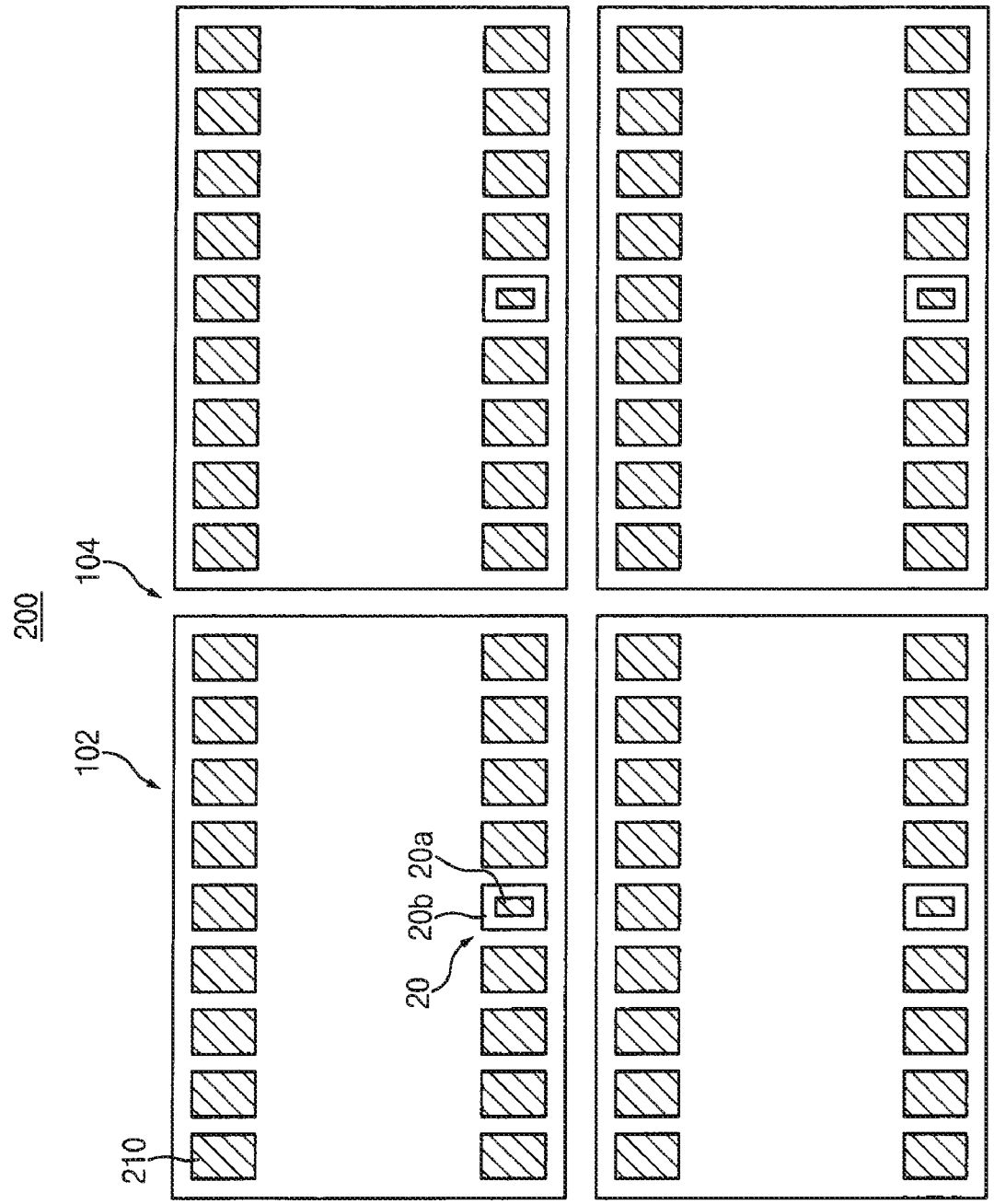
FIG. 20 is a plan view illustrating a substrate having a semiconductor device in accordance with an eleventh embodiment of the present invention.
Figure 21:
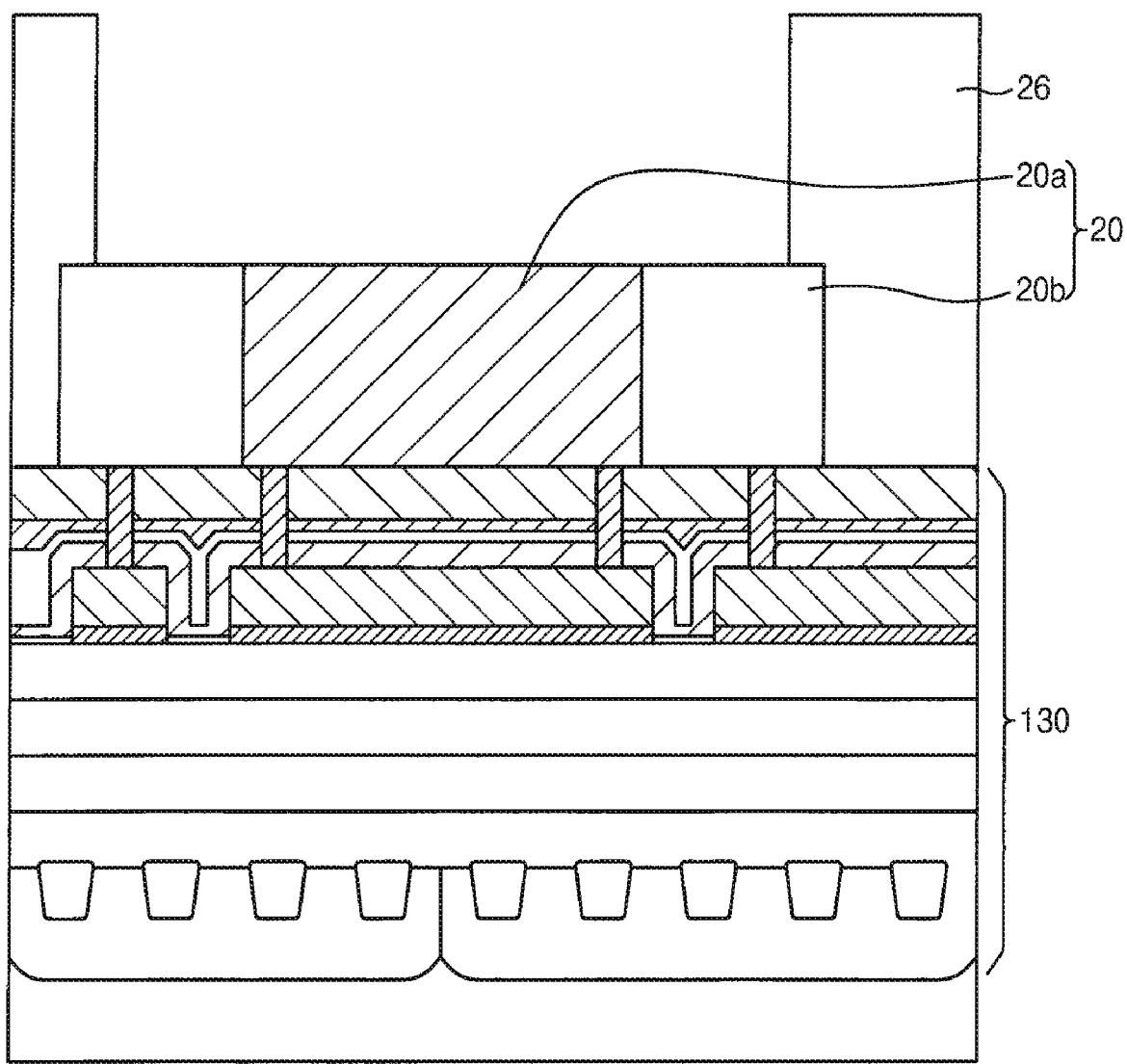
FIG. 21 is a cross sectional view illustrating a second pad of the semiconductor device in FIG. 20.

FIG. 20 is a plan view illustrating a substrate having a semiconductor device in accordance with an eleventh embodiment of the present invention. FIG. 21 is a cross sectional view illustrating a second pad of the semiconductor device in FIG. 20.

A substrate 100 is divided into chip regions 102 and scribe lanes 104 between the chip regions 102. A plurality of semiconductor devices is formed in the chip regions 102, respectively.

Structures 130 in the single semiconductor device are formed in the chip regions 102, respectively. A plurality of first pads 210 for inputting/outputting data signals into/from the single semiconductor device is provided on the structures. The first pads 210 include a conductive material. A passivation layer (not shown) for protecting the first pads 210 is formed at a periphery of the first pads 210. Additionally, a protection circuit (not shown) for electrically protecting the first pads 210 may be electrically connected to the first pads 210. The protection circuit may include a resistor connected to a ground. Examples of the resistor are a resistance, a diode, (a P-N junction diode or a MOS diode), etc.

A second pad 20 is formed on the chip region 102. The second pad 20 is used for recognizing a normal contact between the first pad 210 and a probe needle.

In particular, the second pad 20 includes a probing region 20a with which the probe needle makes contact, and a sensing region 20b bordering an edge of the probing region 20a. The sensing region 20b is used for sensing whether the probe needle makes contact with a region beyond the probing region 20a. The second pad 20 is substantially identical to the probe pad in Embodiment 3. Thus, any further illustrations of the second pad 20 are omitted.

Referring to FIG. 21, the structures 130 are formed between a lower face of the probing region 20a and the substrate 100. Since the probing region 20a includes a conductive material harder than an insulation material, the structures 130 may not be damaged by the probe needle. A passivation layer 26 including polyimide is formed at peripheries of the first and second pads 210 and 20.

Alternatively, a conductive pattern (not shown) or an insulation pattern (not shown) in place of the structures 130 may be formed between the probing region 20a and the substrate 100.

The first and second pads 210 and 20 have substantially identical configurations and sizes. Alternatively, the second pad 20 may have sides in the Y-direction substantially identical to those of the first pad 210.

The second pad 20 is arranged on the chip region 102. Each second pad 20 is arranged on each of the semiconductor devices. Alternatively, the second pad 20 may be arranged on a group including at least one semiconductor device.

The second pad 20 may be arranged on the scribe lane 104. A single second pad 20 is arranged on the scribe lane 104 between two semiconductor devices. The second pad 20 may be arranged on the scribe lane 104 between groups including at least one semiconductor device.

Embodiment 12

Figure 22:
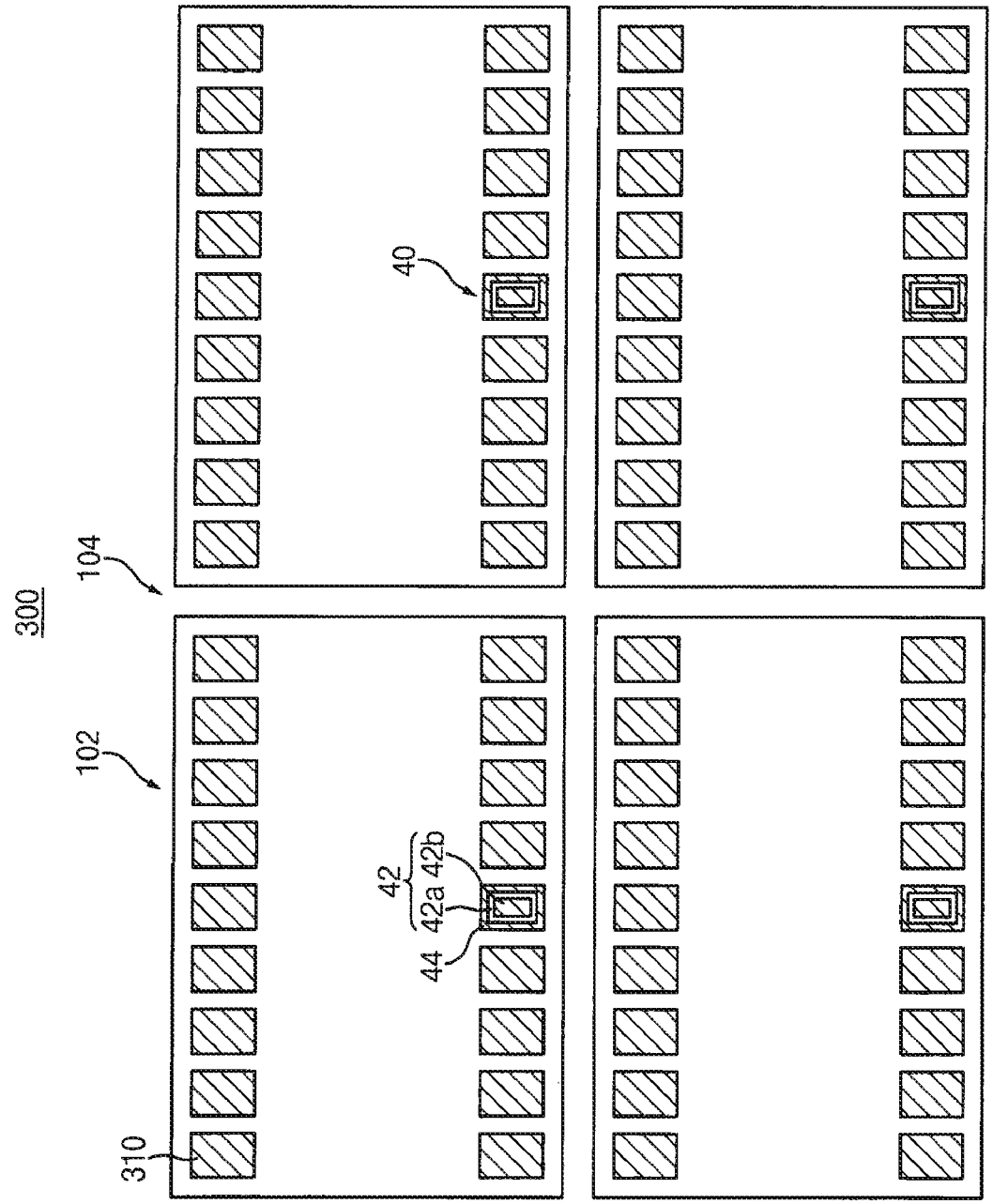
FIG. 22 is a plan view illustrating a substrate having a semiconductor device in accordance with a twelfth embodiment of the present invention.
Figure 23:
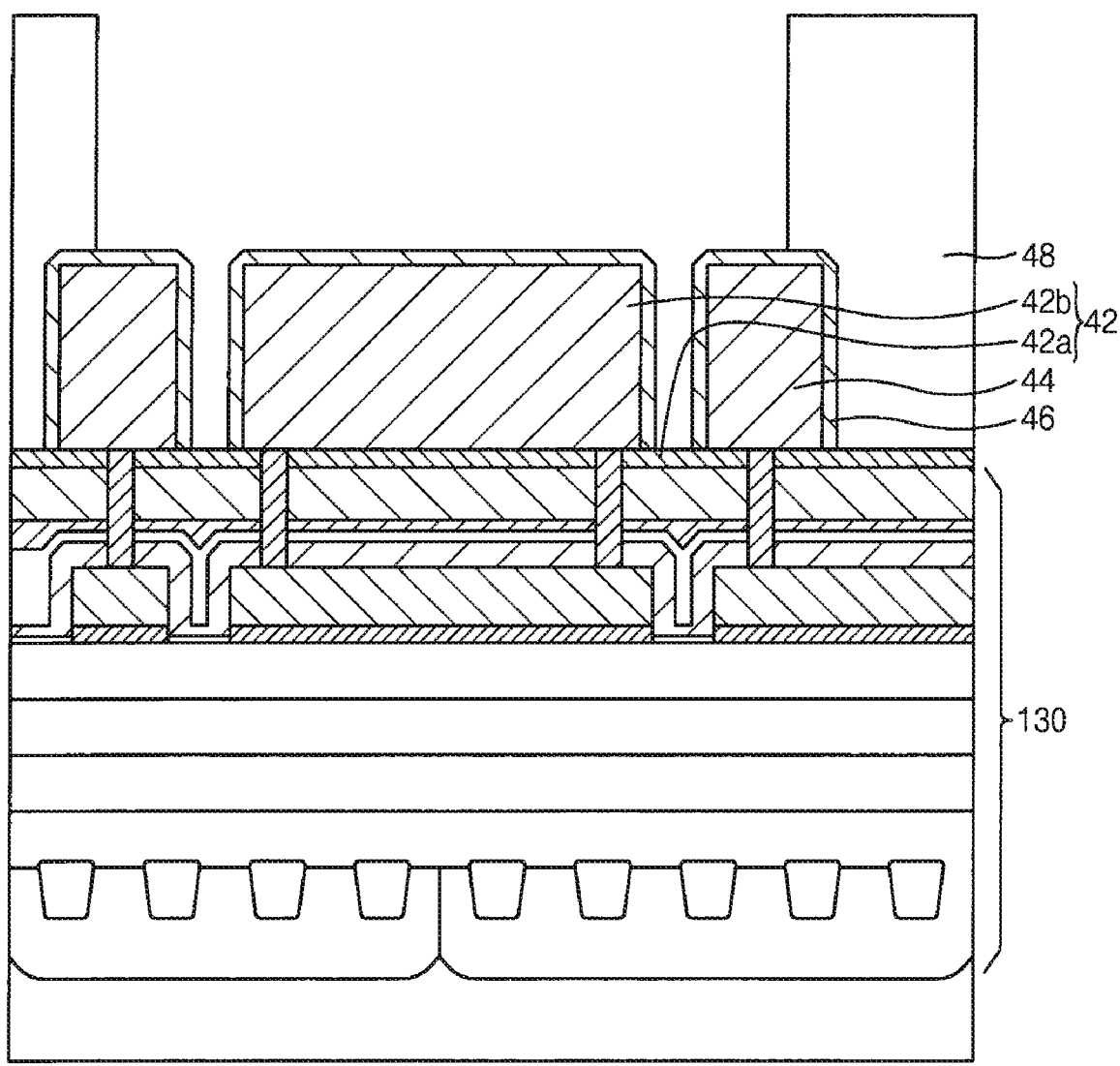
FIG. 23 is a cross sectional view illustrating a second pad of the semiconductor device in FIG. 22.

FIG. 22 is a plan view illustrating a substrate having a semiconductor device in accordance with a twelfth embodiment of the present invention. FIG. 23 is a cross sectional view illustrating a second pad of the semiconductor device in FIG. 22.

A substrate 100 is divided into chip regions 102 and scribe lanes 104 between the chip regions 102. A plurality of semiconductor devices is formed in the chip regions 102, respectively.

A plurality of first pads 310 for inputting/outputting data signals into/from each of the semiconductor devices is provided on the chip regions 102, respectively. The first pads 310 include a conductive material. Additionally, a protection circuit (not shown) for electrically protecting the first pads 310 may be electrically connected to the first pads 310. The protection circuit may include a resistor connected to a ground.

A second pad 40 for recognizing a normal contact between the first pad 310 and a probe needle includes a probing region 42 with which the probe needle makes contact, and a sensing region 44 bordering an edge of the probing region 42. The sensing region 44 is used for sensing whether the probe needle makes contact with a region beyond the probing region 42. The second pad 40 is substantially identical to the probe pad in Embodiment 5. Thus, any further illustrations of the second pad 40 are omitted.

Referring to FIG. 23, structures 130 are formed between a lower face of the probing region 42 and the substrate 100. Since the probing region 42 includes a conductive material harder than an insulation material, the structures 130 may not be damaged due to the probe needle. A passivation layer 48 including polyimide is formed at peripheries of the first and second pads 310 and 40.

Alternatively, a conductive pattern (not shown) or an insulation pattern (not shown) in place of the structures 130 may be formed between the probing region 42 and the substrate 100.

The first and second pads 310 and 40 have substantially identical configurations and sizes. Alternatively, the second pad 40 may have sides in the Y-direction substantially identical to those of the first pad 210.

The second pad 40 is arranged on the chip region 102. Each second pad 40 is arranged on each of the semiconductor devices. Alternatively, the second pad 40 may be arranged on a group including at least one semiconductor device.

The second pad 40 may be arranged on the scribe lane 104. A single second pad 40 may be arranged on the scribe lane 104 between two semiconductor devices. Also, the second pad 40 may be arranged on the scribe lane 104 between groups including at least one semiconductor device.

Embodiment 13

Figure 24:
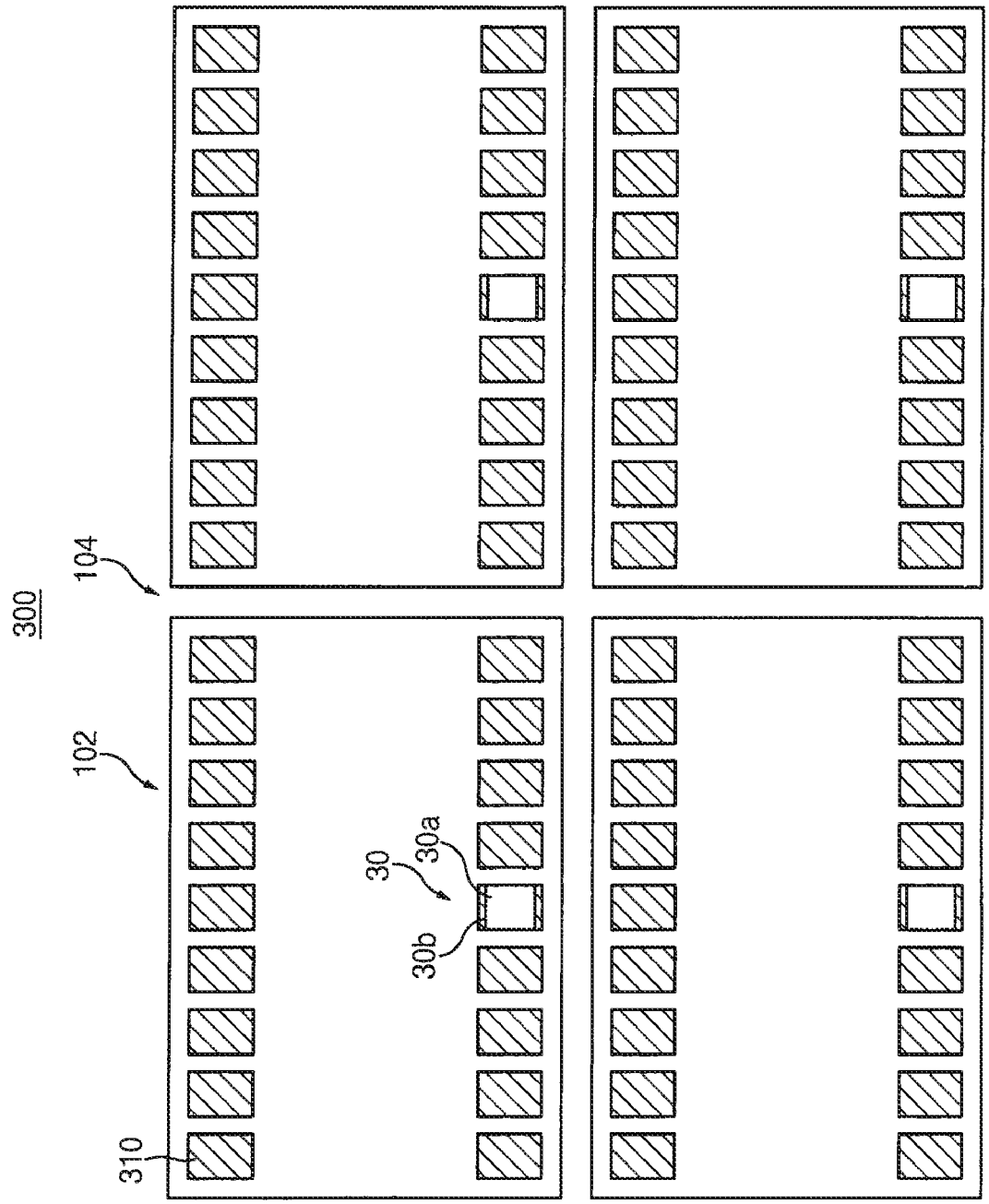
FIG. 24 is a plan view illustrating a substrate having a semiconductor device in accordance with a thirteenth embodiment of the present invention.

FIG. 24 is a plan view illustrating a substrate having a semiconductor device in accordance with a thirteenth embodiment of the present invention. A second pad 30 in accordance with the present embodiment is substantially identical to that in Embodiment 4. Thus, same reference numerals refer to same elements and any further illustrations of the same elements are omitted.

The second pad 30 is arranged on the chip region 102. Each second pad 30 is arranged on each of the semiconductor devices. Alternatively, the second pad 30 may be arranged on a group including at least one semiconductor device.

The second pad 30 may be arranged on the scribe lane 104. A single second pad 30 may be arranged on the scribe lane 104 between two semiconductor devices. Also, the second pad 30 may be arranged on the scribe lane 104 between groups including at least one semiconductor device.

Hereinafter, methods of testing a semiconductor device on the substrates in Embodiments 7 to 13 are illustrated in detail.

When semiconductor devices are constituted on a semiconductor substrate, the semiconductor devices are electrically tested by an EDS process. In the EDS process, probe needles make contact with pads on each of the semiconductor devices to input/output a signal into/from the pads.

Generally, the probe needle has a tip making contact with the pad. The tip may have an "L" shape. Thus, a contact area between the probe needle and the pad may vary in accordance with an inclined angle of the tip. Here, when the inclined angle of the tip is relatively small or when the probe needle is not aligned with the probe pad, the probe pad may be damaged if the probe needle makes contact with an edge of the probe pad that is parallel to a sliding direction of the probe needle. Therefore, a process for determining whether the probe needle normally makes contact with the probe pad is included in a process for testing the semiconductor device.

Figure 25:
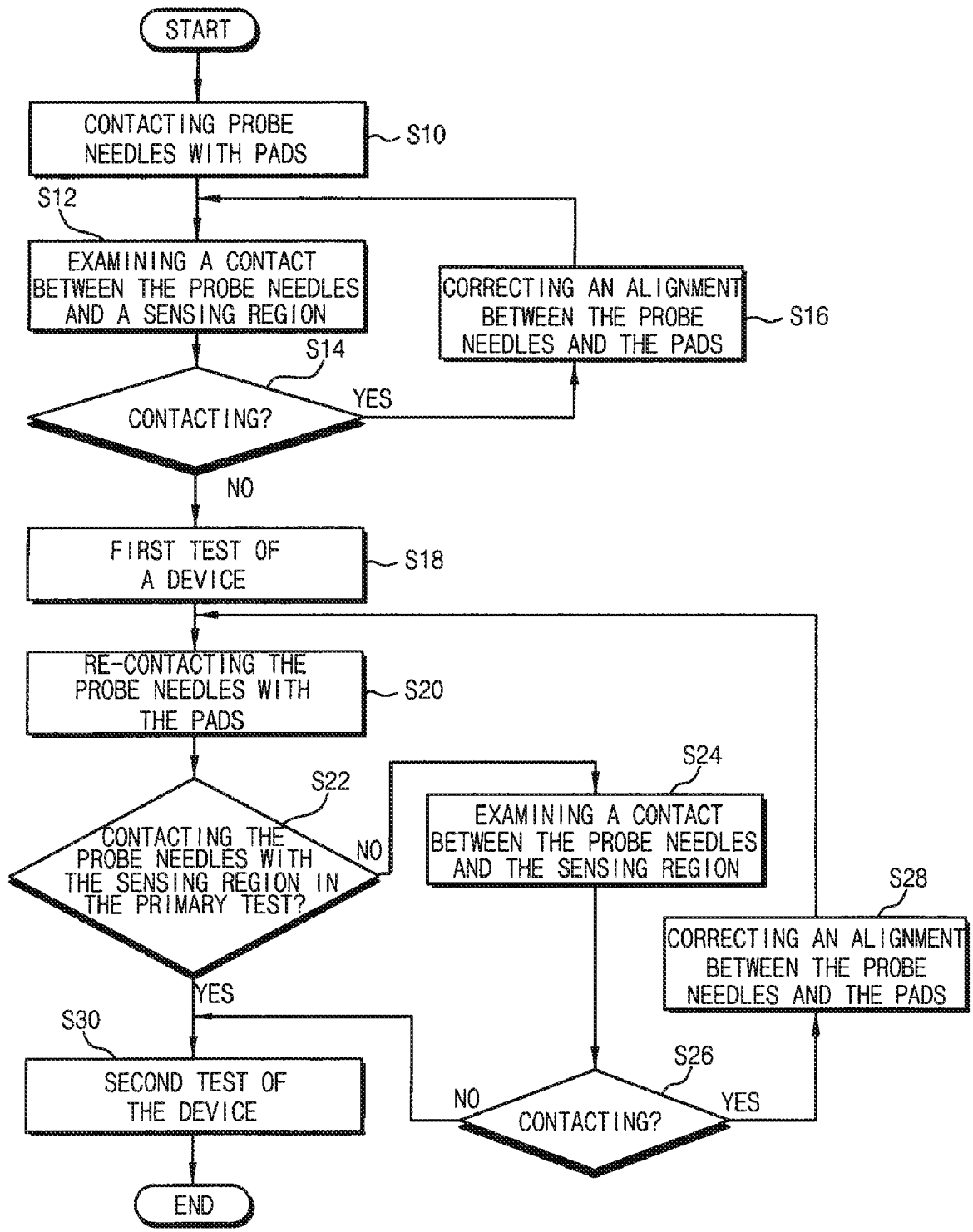
FIG. 25 is a flow chart illustrating a method of testing a semiconductor device in accordance with an embodiment of the present invention.
Figure 27:
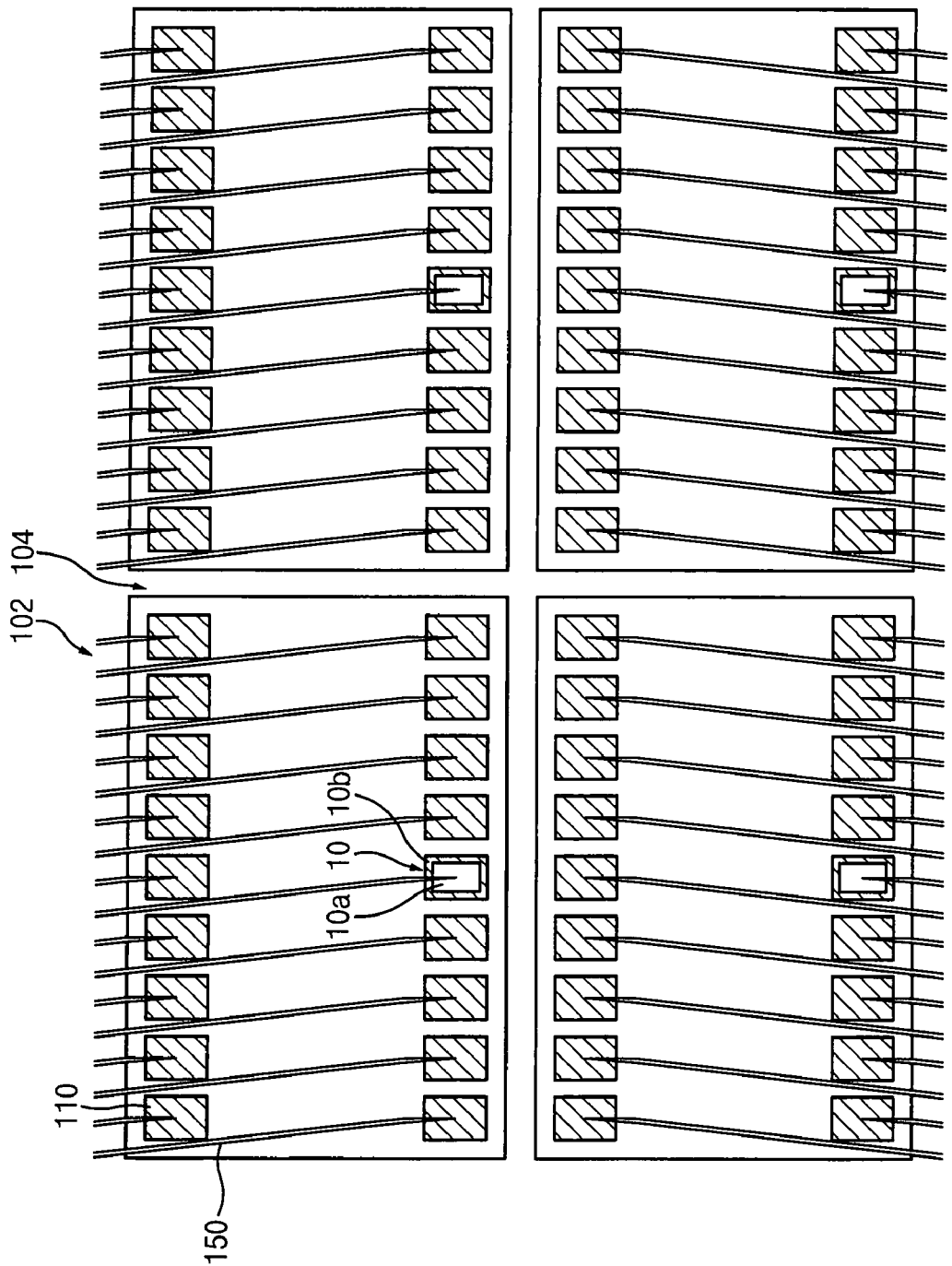
FIG. 27 is a plan view illustrating a contact between a semiconductor device and a probe card.

FIG. 25 is a flow chart illustrating a method of testing a semiconductor device in accordance with an embodiment of the present invention. FIG. 27 is a plan view illustrating a contact between a semiconductor device and a probe card.

Referring to FIGS. 25 and 27, in step S10, the probe needles 150 make contact with the first pads 110 for inputting/outputting data signals into/from the semiconductor device and the second pads 10, including the probing region 10a and the sensing region 10b at the edge of the probing region 10a, respectively.

In particular, a probe card having the probe needles 150 is aligned with the substrate. The probe needles 150 then make contact with the first and second pads 110 and 10, respectively. Here, the probe needles 150 simultaneously make contact with the first and second pads 110 and 10 in each of the semiconductor devices, so that each of the semiconductor devices is simultaneously tested by a following process.

In step S12, a determination is made as to whether or not there is a contact between the probe needles 150 and the sensing region 10b.

Particularly, a current is selectively provided to the second pad 10 through the probe needles 150. A voltage at the second pad 10 is then measured. Here, a voltage due to the probe needles 150 making contact with the probing region 10a is quite different from a voltage due to the probe needles 150 making contact with the sensing region 10b. A voltage range to be measured when the probe needles 150 make contact with the probing region 10a is set. When a measured voltage is beyond the voltage range, the contact between the probe needles 150 and the sensing region 10b is recognized. Here, when any one among the measured voltages is beyond the voltage range, the contact between the probe needles 150 and the probe pad is determined to be abnormal.

When the current is selectively provided to the second pad 10 through the probe needles 150, the current may be provided to the second pad using separate channels for inputting/outputting an electrical signal. However, if the number of channels is less than the number of second pads 10, then a channel for inputting/outputting the electrical signal into/from any one among the first pads 110 may be commonly used for providing the current to more than one second pad 10.

In the present embodiment, the voltage is measured after the current is provided. On the contrary, the current may be measured after the voltage is applied to test the position failure of the probe needle.

If an abnormal contact between the probe needles 150 and the sensing region 10b is determined in step S14, then an alignment between the probe card and the first and second pads 110 and 10 is corrected in step S16. To correct the alignment, the probe needles 150 are separated from the first and second pads 110 and 10. The probe needles 150 are again aligned with the first and second pads 110 and 10.

On the contrary, if it is determined that the probe needles 150 make a normal contact with the probing region 10a, and not the sensing region 10b, then a first test is performed on the semiconductor in step S18. Here, the first test may include a wafer burn-in test, a pre-laser test, a post-laser test, etc.

When the first test is completed, the probe needles 150 are separated from the first and second pads 110 and 10. Additionally, after the first test is completed, a laser repair process or a second test may be further performed. To perform the laser repair process or the second test, the probe card is aligned with the first and second pads 110 and 10. In step S20, the probe needles 150 again make contact with the first and second pads 110 and 10.

In step S22, it's determined if there is a contact between the probe needles 150 and the sensing region 10b during the first test. When the probe needles 150 make contact with the sensing region 10b, the sensing region 10b may be damaged or deformed. Thus, when the probe needles 150 make contact with the sensing region 10b in the first test, the result of testing the positions of the probe needles 150 may not be reliable.

When the probe needles 150 make contact with the sensing region 10b in the first test, the process for determining the contact between the probe needles 150 and the sensing region 10b is omitted. In step S30, a second test is carried out.

On the contrary, when the probe needles 150 normally make contact with the probing region 10a, in step S24, the probe needles 150 making contact with the sensing region 10b is examined.

In step S30, when the contact between the probe needles 150 and the probing region 10a is recognized, the second test is carried out. However, when the contact between the probe needles 150 and the sensing region 10b is recognized, in step S28, an alignment between the probe card and the pads 110 and 10 is corrected. In steps S20 and S22, the probe needles 150 again make contact with the pads 110 and 10 and then the tests are repeatedly performed.

Figure 26:
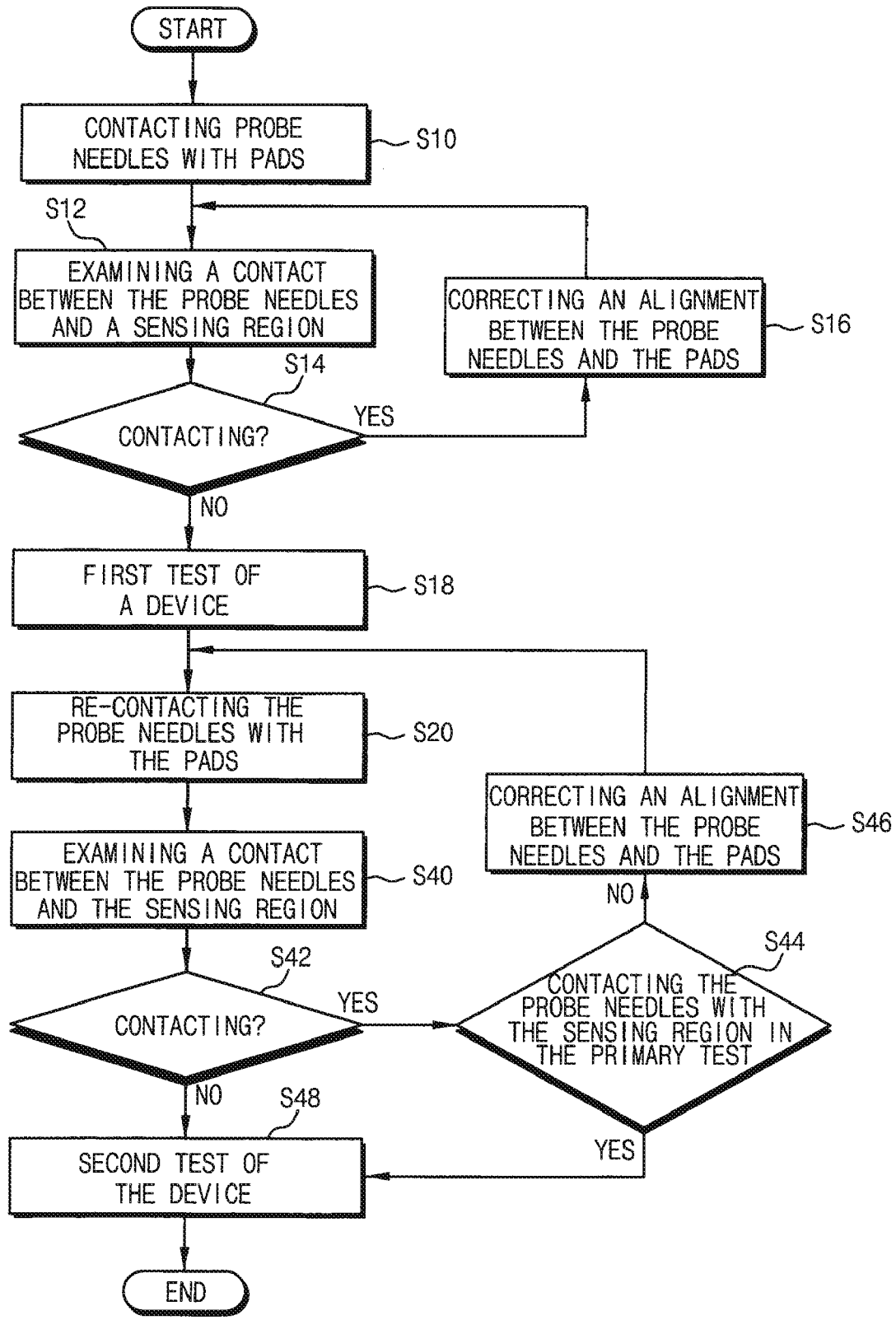
FIG. 26 is a flow chart illustrating a method of testing a semiconductor device in accordance with another embodiment of the present invention.

FIG. 26 is a flow chart illustrating a method of testing a semiconductor device in accordance with another embodiment of the present invention. The method of the present embodiment includes processes substantially identical to those until the first test, illustrated with reference to FIG. 25, is completed.

When the first test illustrated with reference to FIG. 25 is completed, the probe needles 150 are separated from the first and second pads 110 and 10. Additionally, after the first test is completed, the laser repair process or the second test may be performed. To perform the laser repair process or the second test, the probe card is aligned with the first and second pads 110 and 10. In step S20, the probe needles 150 again make contact with the first and second pads 110 and 10.

In step S40, a contact between the probe needles 150 and the sensing region 10b in the first test is recognized. In step S42, when the probe needles 150 do not make contact with the sensing region 10b in the first test, a second test is directly carried out in step S48.

On the contrary, in step S42, when the probe needles 150 make contact with the sensing region 10b, the probe needles 150 making contact with the sensing region 10b in the first test is examined.

In step S44, when the probe needles 150 make contact with the sensing region 10b in the first test, the process for recognizing the contact between the probe needles 150 and the sensing region 10b is omitted. In step S48, the second test is directly carried out.

On the contrary, when the probe needles 150 normally make contact with the probing region 10a, in step S44, an alignment between the probe card and the pads 110 and 10 is corrected in step S46. In steps S20 and S22, the probe needles 150 again make contact with the pads 110 and 10 and then the tests are repeatedly performed.

Embodiment 14

Figure 28:
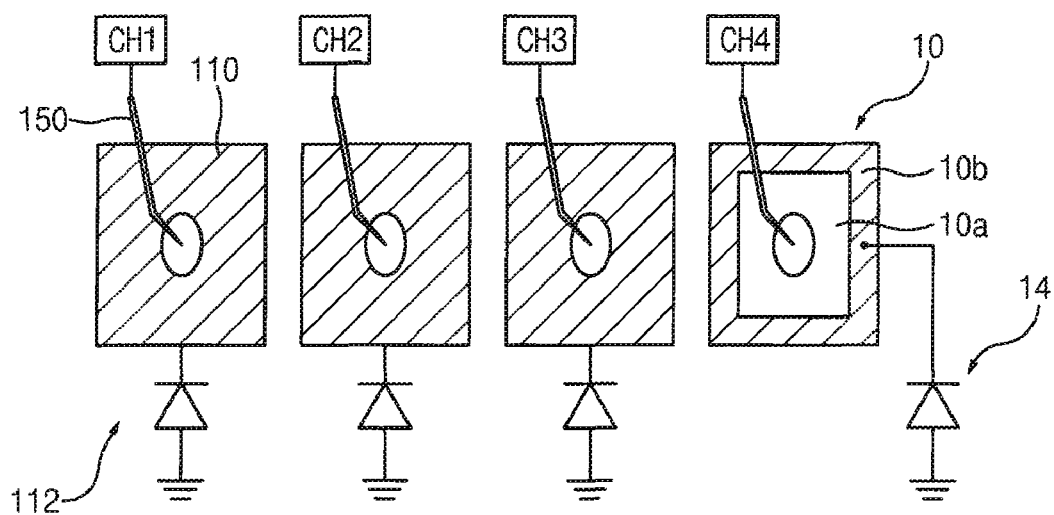
FIGS. 28 and 29 are plan views illustrating a method of testing a semiconductor device in accordance with a fourteenth embodiment of the present invention.
Figure 29:
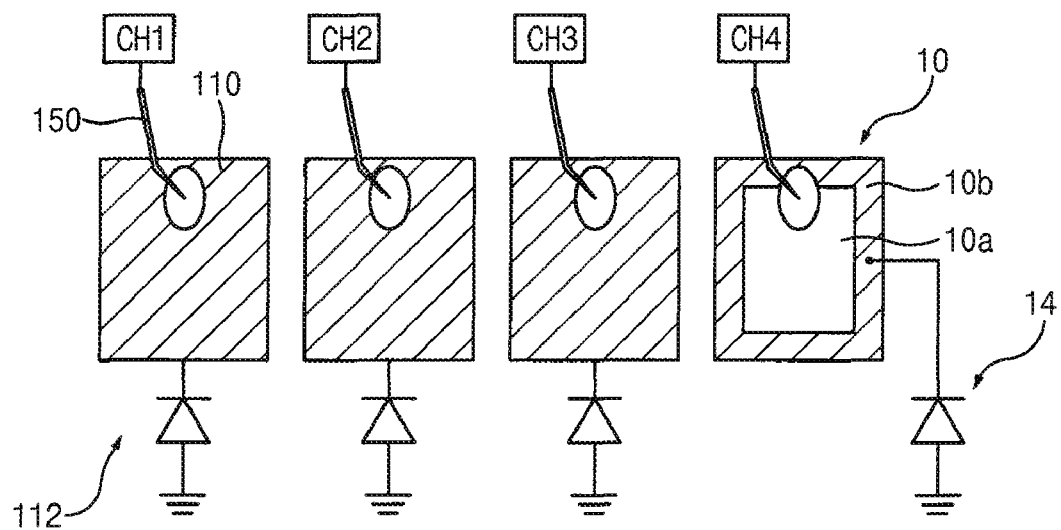

FIGS. 28 and 29 are plan views illustrating a method of testing a semiconductor device in accordance with a fourteenth embodiment of the present invention. The method of the present embodiment is employed in testing the semiconductor devices in Embodiments 7, 8, 9, 10, 12 and 13.

A pre-laser test in the method of the present embodiment is illustrated in detail.

The probe needles make contact with the first pads for inputting/outputting data signals into/from the semiconductor device and the second pads including the probing region and the sensing region at the edge of the probing region, respectively.

In particular, a probe card having the probe needles is aligned with the substrate. The probe needles then make contact with the first and second pads, respectively. Here, the probe needles simultaneously make contact with the first and second pads in each semiconductor device so that the semiconductor device is simultaneously tested by a following process.

An open/short test for recognizing an electrical connection between the first pads and the probe needles is carried out. When a failure in the open/short test is not generated, a contact between the probe needles and the sensing region is examined. When the probe needles make contact with the sensing region, a contact between the probe card and the first and second pads is determined to be abnormal.

Referring to FIGS. 28 and 29, in the present embodiment, a current of about −10 μA to −500 μA is selectively provided to the second pad 10 through the probe needles 150. A voltage range is set in providing the current. The voltage range may be about −3V to about −5V. Here, the current may be provided to the second pad 10 through the probe needles 150 using four separate channels for inputting/outputting an electrical signal.

A voltage of the second pad 10 is then measured. Here, as shown in FIG. 28, when the probe needles 150 make contact with the probing region 10a, the contact between the probe needles 150 and the first and second pads 110 and 10 is determined to be normal. Since the probing region 10a is not electrically connected to anything, the probing region 10a is in floating state. Thus, when the current of about −10 μA to −500μ is provided to the second pad 10, the voltage is decreased by a minus voltage to the vicinity of the voltage range.

On the contrary, as shown in FIG. 29, when the probe needles 150 make contact with the sensing region 10b, the contact between the probe needles 150 and the pads 110 and 10 is determined to be abnormal. Since the sensing region 10b includes the conductive material, the current flows through the sensing circuit 14. Thus, when the sensing circuit 14 has a low resistance, the voltage is increased to a vicinity of about 0V. Moreover, when the sensing region 10b is directly connected to the ground without the resistor, the measured voltage is about 0V.

When the measured voltage is beyond the voltage range, it is determined that the probe needles 150 make contact with the sensing region 10b. For example, if the measured voltage is about −200 mV to about −6,000 mV, it is determined that the probe needles 150 do not make contact with the sensing region 10b. However, the voltage range as a standard of judgment may vary in accordance with the current, the resistor in the sensing circuit 14, etc., so that the voltage range is not limited within the above-mentioned range.

When the probe needles 150 do not make contact with the sensing region 10b, the contact between the probe needles 150 and the probe pad is determined to be normal. A first test is then carried out on the semiconductor device. Here, the first test may include a standby current test, an operation current test, a leakage current test, etc.

When the probe needles 150 make contact with the sensing region 10b, an alignment between the probe card and the first and second pads 110 and 10 is corrected before initially testing the semiconductor device. To correct the alignment, the probe needles 150 are separated from the first and second pads 110 and 10. The probe card is realigned with the first and second pads 110 and 10. The probe needles 150 again make contact with the first and second pads 110 and 10. The first test is carried out on the semiconductor device.

After the first test is completed, the probe needles 150 are separated from the first and second pads 110 and 10.

When the above-mentioned pre-laser test is completed, the laser repair process for repairing repairable chips among chips that are classified to be abnormal is performed.

When the laser repair process is completed, the post-laser test for recognizing whether or not the repair process is normally carried out is executed. Here, the repaired chips are determined to be normal or abnormal by the post-laser test. The post-laser test is substantially similar to the pre-laser test. Thus, any further illustrations of the post-laser test are omitted.

An open/short test for recognizing an electrical connection between the first pads and the probe needles is carried out. When a failure in the open/short test is not generated, a contact between the probe needles 150 and the sensing region 10b in the previous processes is examined.

When the probe needles 150 make contact with the sensing region 10b in the pre-laser test, a second test is directly carried out. The second test is substantially identical to the first test in the pre-laser test.

On the contrary, when the probe needles 150 normally make contact with the probing region 10a, in step S24, a contact between the probe needles 150 and the sensing region 10b is examined.

When the probe needles 150 do not make contact with the sensing region 10b, the contact between the probe needles 150 and the probe pad is determined to be normal. However, when the probe needles 150 make contact with the sensing region 10b, an alignment between the probe card and the pads 110 and 10 is corrected. After the probe needles 150 again make contact with the first and second pads 110 and 10, the second test is repeatedly performed.

Chips determined to be normal in the pre-laser test and the post-laser test are finally tested.

The final test is substantially identical to the post-laser test. Particularly, the final test includes the open/short test and the test for examining the alignment of the probe card substantially identical to the post-laser test. After the above processes are performed, a third test corresponding to an actually electrical test is carried out. The third test is carried out under conditions that are different from those of the first and second tests. The EDS process is completed by the above-mentioned processes.

Embodiment 15

Figure 30:
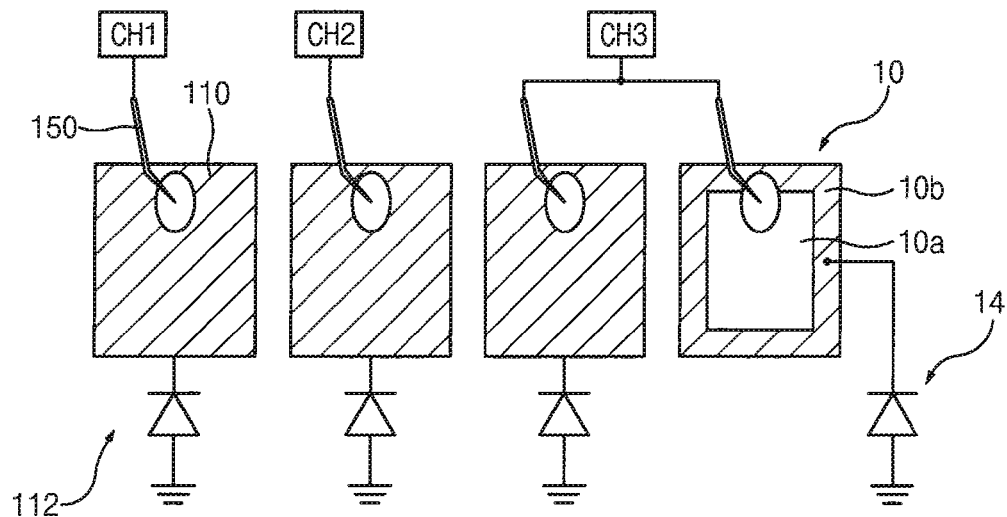
FIG. 30 is a plan view illustrating a method of testing a semiconductor device in accordance with a fifteenth embodiment of the present invention.

FIG. 30 is a plan view illustrating a method of testing a semiconductor device in accordance with a fifteenth embodiment of the present invention.

The method of the present embodiment is employed in testing the semiconductor devices in Embodiments 7, 8, 9, 10, 12 and 13. Also, the method of the present embodiment is substantially identical to that in Embodiment 14 except a process for examining contact positions between probe pads and probe needles. Therefore, only the process for examining the contact position between the probe pads and the probe needles is illustrated herein.

As described above with reference to FIGS. 28 and 29, the probe needles make contact with the first pads for inputting/outputting data signals into/from the semiconductor device and the second pads including the probing region and the sensing region at the edge of the probing region, respectively.

Referring to FIG. 30, first, second and third channels CH1, CH2, and CH3 for inputting/outputting electrical signals into/from the first pads 110 through the probe needles 150 are provided. The channels CH1, CH2, and CH3 are electrically connected to the first pads 110, respectively. The third channel CH3 electrically connected to the first pad 110 is commonly coupled to the probe needle 150 making contact with the second pad 10. Thus, the third channel CH3 is referred to as a common channel.

A current of about −10 μA to −500 μA is selectively provided to the second pad 10 through the probe needles 150 using the common channel CH3 that is electrically connected to the second pad 10. A voltage range is set in providing the current. The voltage range may be about −3V to about −5V. When the current is provided to the second pad 10 using the channels, the current is provided to the first pad 110 coupled to the channels as well as the second pad 10.

A voltage of the second pad 10 is then measured. The current provided to the first pad 110 flows to the ground through the protection circuit 112. Here, since the probing region 10a is not electrically connected to anything, the probing region 10a is in a floating state.

On the contrary, when the probe needles 150 make contact with the sensing region 10b, the current flows to the ground through the sensing circuit so that current paths are formed in the first and second pads 110 and 10, respectively. Thus, the voltage is closer to about 0V compared to that in the contact between the probe needles 150 and the probing region 10a.

A voltage range for conditions with the probe needles 150 normally making contact with the probing region 10a is set using the voltage difference. When the measured voltage is beyond the voltage range, the contact between the probe needles 150 and the sensing region 10b is determined.

When the contact positions of the probe needles 150 are examined using the method of the present embodiment, a resistor in the sensing circuit preferably has a resistance lower than that of a resistor in the protection circuit.

Embodiment 16

Hereinafter, a method of testing a semiconductor device in accordance with a sixteenth embodiment is illustrated. The method of the present embodiment is employed in testing the semiconductor devices in Embodiment 11.

The method of the present embodiment is substantially identical to that in Embodiment 14 except a process for examining contact positions between probe pads and probe needles. Therefore, only the process for examining the contact position between the probe pads and the probe needles is illustrated herein.

Referring to FIG. 20, the probe needles make contact with the first pads 210 for inputting/outputting data signals into/from the semiconductor device and the second pads 20 including the probing region and the sensing region at the edge of the probing region, respectively.

A current of about −10 μA to about −500 μA is selectively provided to the second pad 20 through the probe needles. A voltage range is set in providing the current. The voltage range may be about −3V to about −5V. When the current is provided to the second pad 20 using the channels, the current is provided to the second pad 20 using separated channels.

A voltage of the second pad 20 is then measured. When the probe needles make contact with the probing region 20a, the current flows to the ground through the sensing circuit 24 (see FIG. 6) electrically connected to the probing region 20a because the probing region 20a includes a conductive material. Thus, when the sensing circuit 24 has a low resistance, the voltage is increased to about 0V. Moreover, when the probing region 20b is directly connected to the ground without the resistor, the measured voltage is about 0V.

On the contrary, when the probe needles make contact with the sensing region 20b, the sensing region 20b is in a floating state because the sensing region 20b is not electrically connected to anything and includes an insulation material. Thus, when the current of about −10 μA to about −500 μA is provided to the second pad 10, the voltage is decreased by a minus voltage to the vicinity of the voltage range.

A voltage range for conditions with the probe needles normally making contact with the probing region 20a is set using the voltage difference. When the measured voltage is beyond the voltage range, the contact between the probe needles and the sensing region 20b is determined.

Alternatively, a channel electrically connected to the first pad 210 may be coupled to the probe needle making contact with the second pad 20. The channel may be commonly used. The normal contact between the probe card and the substrate is examined using the above-mentioned methods.

Embodiment 17

Figure 31:
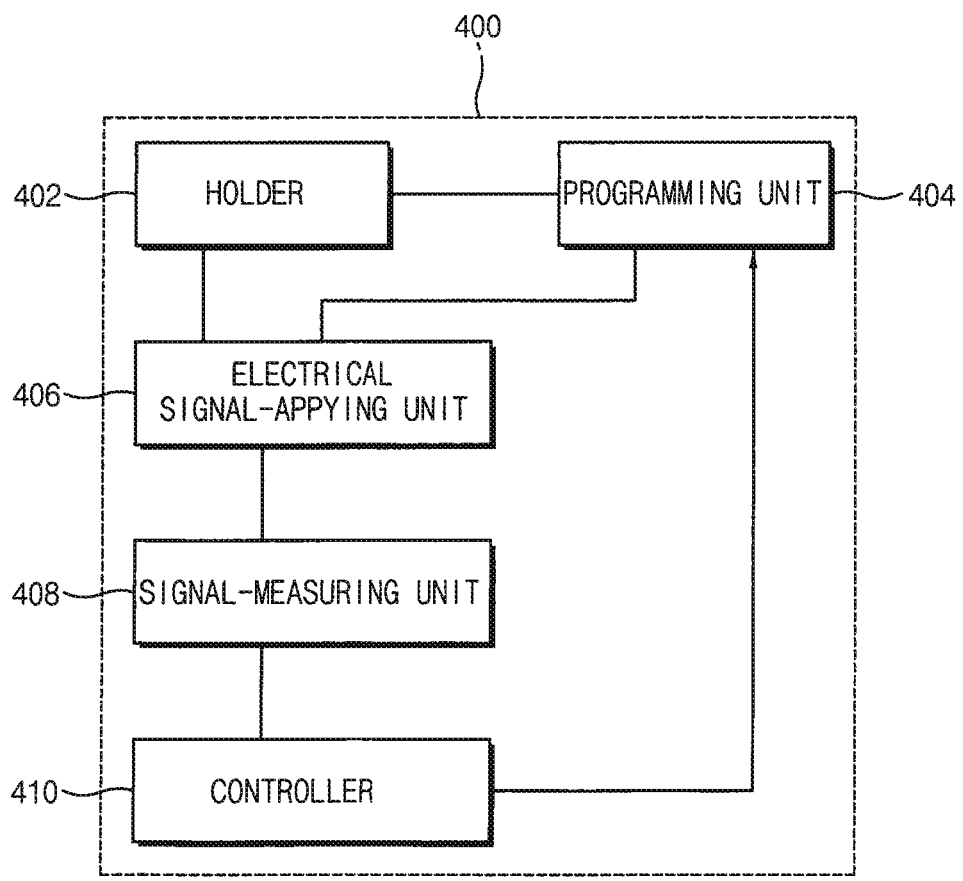
FIG. 31 is a block diagram illustrating a tester for testing a semiconductor device in accordance with a seventeenth embodiment of the present invention.

FIG. 31 is a block diagram illustrating a tester for testing a semiconductor device in accordance with a seventeenth embodiment of the present invention.

A tester 400 in accordance with the present embodiment includes a holder 402 for holding a probe card. The probe card includes probe needles making contact with first and second pads formed on a semiconductor device. When the semiconductor device is replaced with another one, positions and sizes of the pads on the semiconductor device may be changed. Thus, the holder 402 is configured so that the probe card corresponding to the replaced semiconductor device is to be remounted.

Test conditions are stored in a test-programming unit 404 by test items of the semiconductor device. The semiconductor device is tested using a program in the test-programming unit 404 that is feasible for testing the semiconductor device.

An electrical signal-applying unit 406 applies an electrical signal to the first pad for inputting/outputting data signals into/from the semiconductor device and the second pad for examining an alignment between the probe needles and the first pad. The electrical signal-applying unit 406 applies the electrical signal, which corresponds to each of the test conditions in the test-programming unit 404, to the first and second pads. The electrical signal-applying unit 406 includes a plurality of channels for inputting/outputting the electrical signal into/from the first and second pads. The numbers of the channels correspond to effective numbers of the first pads. Here, the effective numbers of the first pads are numbers of the first pads into/from which at least one electrical signal is inputted/outputted in processing the test items.

A signal-measuring unit 408 measures the electrical signal outputted from the first and second pads. A controller 410 receives a measured signal from the signal-measuring unit 408 and orders the test of the semiconductor device.

For example, to recognize the normal contact of the probe needles, the signal-measuring unit 408 measures a voltage in the second pad. When the measured voltage is within a voltage range, the controller 410 orders the test of the semiconductor device.

After the normal contact of the probe needles is recognized using the tester, the semiconductor device is substantively tested using the current.

According to an embodiment of the present invention, after the normal contact of the probe needles is recognized using the probe pad in the EDS process, the semiconductor device is substantively tested using the current.

Thus, when the probe needles abnormally make contact with the probe pads, the alignment between the probe pads and the probe needles is immediately corrected. As a result, the edge of the probe pad may not be damaged with the probe needles so that the possibility of a failure of the probe pads may be suppressed.

Having described the preferred embodiments of the present invention, it is noted that modifications and variations can be made by persons skilled in the art in light of the above teachings. It is therefore to be understood that changes may be made in the particular embodiments of the present invention disclosed which is within the scope and the spirit of the invention outlined by the appended claims.

What is claimed is:

1. A probe pad for use in testing a semiconductor device, the probe pad comprising:
    a square-shaped probing region adapted for contact with a probe needle; and
    a sensing region adjacent an edge of the probing region, the sensing region adapted for sensing whether or not a probe needle makes contact with a position beyond the probing region, wherein the edge of the probing region is rectangular having four sides and the sensing region is contiguous with all four sides of the probing region rectangular edge, the sensing region having a first width contiguous a first set of opposing sides of the probing region rectangular edge, and a second width different from the first width contiguous a second set of opposing sides of the probing region rectangular edge.

2. The probe pad of claim 1, wherein the sensing region is non-square.

3. The probe pad of claim 2, wherein the sensing region is rectangular-shaped.

4. The probe pad of claim 1, wherein the probing region and the sensing region have upper faces in substantially the same plane.

5. The probe pad of claim 1, wherein the probing region and the sensing region have upper faces in different planes and wherein the probing region upper face is lower than the sensing region upper face.

6. The probe pad of claim 1, wherein the sensing circuit is electrically connected to the sensing region, and wherein the sensing circuit includes a diode coupled between a ground and the sensing region.

7. The probe pad of the claim 6, wherein the diode includes a P-N junction diode and a MOS diode.

8. A probe pad for use in testing a semiconductor device, the probe pad comprising:
    a probing region adapted for contact with a probe needle; and
    a sensing region adjacent an edge of the probing region, the sensing region adapted for sensing whether or not a probe needle makes contact with a position beyond the probing region, wherein the probing region includes a conductive material.

9. The probe pad of claim 8, wherein the conductive material is metal.

10. The probe pad of claim 8, wherein, the sensing region includes an insulating material.

11. The probe pad of claim 10, further including a sensing circuit electrically connected to the probing region.

12. The probe pad of claim 11, wherein the sensing circuit is coupled to ground.

13. The probe pad of claim 12, wherein the sensing circuit includes a resistor coupled between ground and the probing region.

14. A probe pad for use in testing a semiconductor device, the probe pad comprising:
    a probing region adapted for contact with a probe needle; and
    a sensing region adjacent an edge of the probing region, the sensing region adapted for sensing whether or not a probe needle makes contact with a position beyond the probing region; and
    a sensing circuit electrically connected to the probing region.

15. The probe pad of claim 14, wherein the sensing circuit is coupled to ground.

16. The probe pad of claim 15, wherein the sensing circuit includes a resistor coupled between ground and the probing region.

17. The probe pad of claim 14, wherein the probing region and the sensing region have upper faces in substantially the same plane.

18. The probe pad of claim 14, wherein the probing region and the sensing region have upper faces in different planes and wherein the probing region upper face is lower than the sensing region upper face.

19. The probe pad of claim 14, wherein the sensing circuit is electrically connected to the sensing region, and wherein the sensing circuit includes a diode coupled between a ground and the sensing region.

20. The probe pad of the claim 19, wherein the diode includes a P-N junction diode and a MOS diode.

* * * * *

UNITED STATES PATENT AND TRADEMARK OFFICE
CERTIFICATE OF CORRECTION

PATENT NO.        : 7,880,493 B2                         Page 1 of 1
APPLICATION NO.   : 12/567583
DATED             : February 1, 2011
INVENTOR(S)       : Kun-Up Kim et al.

It is certified that error appears in the above-identified patent and that said Letters Patent is hereby corrected as shown below:

On the Title Page, under the Related U.S. Application Data section (60), delete ", which is a continuation of application No. 11/565,471, filed on Nov. 30, 2006, now Pat. No. 7,612,573"

Signed and Sealed this

Thirteenth Day of September, 2011

David J. Kappos
*Director of the United States Patent and Trademark Office*